US012803425B2

(12) United States Patent
Ban et al.

(10) Patent No.: US 12,803,425 B2
(45) Date of Patent: Nov. 17, 2026

(54) ELECTRICAL DEVICE ACTIVELY OPERATING AT MULTIPLE INPUT VOLTAGES AND METHOD FOR CONTROLLING SAME

(71) Applicant: SAMSUNG ELECTRONICS CO., LTD., Suwon-si (KR)

(72) Inventors: Jieun Ban, Suwon-si (KR); Junghyun Lee, Suwon-si (KR); Youngjae Park, Suwon-si (KR); Jehyung Cho, Suwon-si (KR); Teaho Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 60 days.

(21) Appl. No.: 18/977,362

(22) Filed: Dec. 11, 2024

(65) Prior Publication Data

US 2025/0112545 A1 Apr. 3, 2025

Related U.S. Application Data

(63) Continuation of application No. PCT/KR2023/005080, filed on Apr. 14, 2023.

(30) Foreign Application Priority Data

Jun. 24, 2022 (KR) ........................ 10-2022-0077809

(51) Int. Cl.

| | |
|---|---|
| ***H02M 1/42*** | (2007.01) |
| ***G01R 19/165*** | (2006.01) |
| ***H02M 1/32*** | (2007.01) |

(52) U.S. Cl.

CPC .... *H02M 1/4225* (2013.01); *G01R 19/16552* (2013.01); *H02M 1/32* (2013.01)

(58) Field of Classification Search

CPC .. H02M 1/4225; H02M 1/32; G01R 19/16552

See application file for complete search history.

(56) References Cited

U.S. PATENT DOCUMENTS 6,191,565 B1 2/2001 Lee et al.
6,801,027 B2 10/2004 Hann et al.

(Continued)

FOREIGN PATENT DOCUMENTS

CN 111082651 A * 4/2020 .......... H02M 1/4225
JP 3226904 B2 11/2001

(Continued)

OTHER PUBLICATIONS

Machine translation of CN111082651 by Clarivate Analytics, Jun. 2026, 10 pages.*

(Continued)

*Primary Examiner* — Harry R Behm

(74) *Attorney, Agent, or Firm* — Sughrue Mion, PLLC

(57) ABSTRACT

An electrical device includes a power factor correction circuit including a switch, a first voltage sensor, a second voltage sensor, a memory storing instructions, and at least one processor configured to obtain second input voltage information of the electrical device, based on first input voltage information and DC link voltage information, compare the second input voltage information with preset reference voltage information, determine, based on a comparison of the second input voltage information with the preset reference voltage information, whether an input voltage of the electrical device is at least one of a low voltage or a high voltage, set a protection level of the power factor correction circuit based on the input voltage, and control an operating cycle of the switch of the power factor correction circuit, based on the protection level of the power factor correction circuit.

18 Claims, 17 Drawing Sheets

(56) References Cited

U.S. PATENT DOCUMENTS

| | | | | |
|---|---|---|---|---|
| 6,980,445 | B2 | 12/2005 | Fukumoto et al. | |
| 9,379,579 | B2 | 6/2016 | Kinnard | |
| 10,158,282 | B1 | 12/2018 | Maruyama | |
| 10,707,641 | B2 | 7/2020 | Honda | |
| 2013/0329472 | A1 | 12/2013 | Chen | |
| 2016/0033560 | A1* | 2/2016 | Thanner | G01R 19/16552 324/764.01 |
| 2017/0353028 | A1* | 12/2017 | Makino | H02H 3/24 |
| 2024/0055974 | A1* | 2/2024 | Hiasa | H02M 1/0009 |

FOREIGN PATENT DOCUMENTS

| | | | | |
|---|---|---|---|---|
| JP | 2005-57871 | A | 3/2005 | |
| JP | 2005057871 | A * | 3/2005 | A61P 37/00 |
| JP | 3988724 | B2 | 10/2007 | |
| JP | 4691036 | B2 | 6/2011 | |
| JP | 6744356 | B2 | 8/2020 | |
| JP | 2022 30115 | A | 2/2022 | |
| KR | 1996-0008906 | B1 | 7/1996 | |
| KR | 10-0333973 | B1 | 4/2002 | |
| KR | 10-1028795 | B1 | 4/2011 | |
| KR | 10-1141673 | B1 | 5/2012 | |
| KR | 10-1153586 | B1 | 6/2012 | |
| KR | 10-1251846 | B1 | 4/2013 | |
| KR | 10-1397920 | B1 | 5/2014 | |
| KR | 10-1901579 | B1 | 9/2018 | |

OTHER PUBLICATIONS

Machine translation of JP 2005057871 by Clarivate Analytics, Jun. 2026, 7 pages.*

International Search Report (PCT/ISA/210) issued on Jul. 26, 2023 by the International Searching Authority in International Patent Application No. PCT/KR2023/005080.

Written Opinion (PCT/ISA/237) issued on Jul. 26, 2023 by the International Searching Authority in International Patent Application No. PCT/KR2023/005080.

Communication dated May 23, 2025 issued by the European Patent Office in European Patent Application No. 23827344.5.

Communication issued Jun. 25, 2026 by the Korean Ministry of Intellectual Property in Korean Patent Application No. 10-2022-0077809.

* cited by examiner

ELECTRICAL DEVICE ACTIVELY OPERATING AT MULTIPLE INPUT VOLTAGES AND METHOD FOR CONTROLLING SAME

CROSS-REFERENCE TO RELATED APPLICATIONS

This application is a continuation application of International Application No. PCT/KR2023/005080, filed on Apr. 14, 2023, which claims priority to Korean Patent Application No. 10-2022-0077809, filed on Jun. 24, 2022, in the Korean Intellectual Property Office, the disclosures of which are incorporated by reference herein in their entireties.

BACKGROUND

1. Field

The present disclosure relates generally electrical devices, and more particularly, to an electrical device for actively operating at multiple input voltages by using a power factor correction (PFC) circuit, and a method for controlling same.

2. Description of Related Art

Electrical devices may operate as a power source may be applied. The power source of the electrical devices may use different input voltages by countries and regions. For example, in Korea, Vietnam, and Europe, the power source of electrical devices may use a high voltage. The high voltage may be, for example, 220 $V_{ac}$±10%. As another example, in Japan, the United States, Canada, and Taiwan, the power source of electrical devices may use a low voltage. The low voltage may be, for example, 110 $V_{ac}$±10%. Alternatively or additionally, in Brazil, the power source of electrical devices may use either a high voltage or a low voltage.

Consequently, electrical devices may need to be manufactured in consideration of the input voltage of a region where the electrical devices may be used, and/or the users of such electrical devices may need to use transformers as necessary.

To potentially address such a limitation, an electrical device that uses a voltage multiplier and/or a power factor correction (PFC) circuit capable of using both a high voltage and a low voltage as input voltages may have been proposed.

However, an electrical device using a voltage multiplier may need an additional circuit design without improving the power factor, which may increase the cost of the device. An electrical device using a power factor correction circuit may improve the power factor while using alternating current input power sources of both a low voltage and a high voltage. However, because the variation range of the input power sources may be significantly great compared to that of a single input power source, the margins of elements used in the electrical device may need to be selected to sufficiently great values. As a result, the size of the electrical device may increase and/or the price (or cost) of the electrical device may rise.

In addition, because the power factor correction circuit may set only one voltage and one current protection level for protecting the internal elements, internal elements such as, but not limited to, fuses, relays, and/or bridge diodes, included in the electrical device may be damaged when an inrush current is generated while the electrical device operates in a poor power supply region.

Furthermore in order to use, at a low input voltage, the same power as at a high input voltage, the magnitude of input current may increase, which may increase the conduction loss of the electrical device and may relatively lower the operating efficiency of the electrical device.

SUMMARY

The following presents a simplified summary of one or more embodiments of the present disclosure in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments of the present disclosure in a simplified form as a prelude to the more detailed description that is presented later.

According to an aspect of the present disclosure, an electrical device may include a power factor correction circuit including a switch and configured to correct a power factor of the electrical device. The electrical device may include a first voltage sensor configured to detect first input voltage information of the power factor correction circuit. The electrical device may include a second voltage sensor configured to detect direct current (DC) link voltage information of the power factor correction circuit. The electrical device may include a memory storing instructions. The electrical device may include at least one processor communicatively coupled to the power factor correction circuit, the first voltage sensor, the second voltage sensor, and the memory. The at least one processor may be configured to execute the instructions to obtain second input voltage information of the electrical device, based on the first input voltage information and the DC link voltage information. The at least one processor may be configured to execute the instructions to compare the second input voltage information with preset reference voltage information. The at least one processor may be configured to execute the instructions to determine, based on a comparison of the second input voltage information with the preset reference voltage information, whether an input voltage of the electrical device is at least one of a low voltage or a high voltage. The at least one processor may be configured to execute the instructions to set a protection level of the power factor correction circuit based on the input voltage. The at least one processor may be configured to execute the instructions to control an operating cycle of the switch of the power factor correction circuit, based on the protection level of the power factor correction circuit.

In an embodiment, the protection level of the power factor correction circuit may include at least one of an overvoltage protection level, an undervoltage protection level, or an input current limit level.

In an embodiment, the at least one processor may be further configured to execute the instructions to set the overvoltage protection level to a first overvoltage protection level based on the input voltage being the low voltage, set the undervoltage protection level to a first undervoltage protection level based on the input voltage being the low voltage, and set the input current limit level to a first current limit level based on the input voltage being the low voltage. The first overvoltage protection level may be lower than a second overvoltage protection level based on the input voltage being the high voltage. The first undervoltage protection level may be lower than a second undervoltage protection level based on the input voltage being the high voltage. The first current limit level may be higher than a second current limit level based on the input voltage being the high voltage.

In an embodiment, the at least one processor may be further configured to execute the instructions to set the overvoltage protection level to a first overvoltage protection level based on the input voltage being the low voltage, and set the undervoltage protection level to a first undervoltage protection level based on the input voltage being the low voltage. The first overvoltage protection level may be lower than a second overvoltage protection level based on the input voltage being the high voltage. The first undervoltage protection level may be lower than a second undervoltage protection level based on the input voltage being the high voltage.

In an embodiment, the at least one processor may be further configured to execute the instructions to set the input current limit level to a first current limit level based on the input voltage being the low voltage. The first current limit level may be higher than a second current limit level based on the input voltage being the high voltage.

In an embodiment, the at least one processor may be further configured to execute the instructions to control, based on the input voltage being the low voltage, an operation of the power factor correction circuit such that a first DC link maximum boost level of the power factor correction circuit may be equal to a second DC link maximum boost level when the input voltage is the high voltage.

In an embodiment, the electrical device may include a load. In an embodiment, the at least one processor may be further configured to execute the instructions to receive a voltage command based on an operation of the load, and increase, based on the voltage command and the input voltage being the low voltage, the overvoltage protection level and a DC link voltage of the power factor correction circuit.

In an embodiment, the at least one processor may be further configured to execute the instructions to control, based on the input voltage being the low voltage, an operation of the power factor correction circuit to start boosting the DC link voltage at a first voltage. The first voltage may be lower than a second voltage of the DC link voltage when the input voltage is the high voltage.

In an embodiment, the electrical device may include a relay disposed in front of the power factor correction circuit. In an embodiment, the at least one processor may be further configured to execute the instructions to detect a rising slope of the DC link voltage, and control, based on the rising slope of the DC link voltage being greater than or equal to a preset reference value, an operation of the relay to turn the relay off.

According to an aspect of the present disclosure, a method of controlling an electrical device may include detecting, by at least one processor of the electrical device, first input voltage information of a power factor correction circuit of the electrical device. The method may include detecting, by the at least one processor, DC link voltage information of the power factor correction circuit. The method may include obtaining, by the at least one processor, second input voltage information of the electrical device based on the first input voltage information and the DC link voltage information. The method may include comparing, by the at least one processor, the second input voltage information with preset reference voltage information. The method may include determining, based on the comparing of the second input voltage information with the preset reference voltage information, whether an input voltage of the electrical device is at least one of a low voltage or a high voltage. The method may include setting, by the at least one processor, a protection level of the power factor correction circuit, based on the input voltage. The method may include controlling an operating cycle of a switch of the power factor correction circuit based on the protection level of the power factor correction circuit.

In an embodiment, the protection level of the power factor correction circuit may include at least one of an overvoltage protection level, an undervoltage protection level, or an input current limit level.

In an embodiment, the setting of the protection level may include setting, by the at least one processor, the overvoltage protection level to a first overvoltage protection level based on the input voltage being the low voltage, setting, by the at least one processor, the undervoltage protection level to a first undervoltage protection level based on the input voltage being the low voltage, and setting, by the at least one processor, the input current limit level to a first current limit level based on the input voltage being the low voltage. The first overvoltage protection level may be lower than a second overvoltage protection level based on the input voltage being the high voltage. The first undervoltage protection level may be lower than a second undervoltage protection level based on the input voltage being the high voltage. The first current limit level may be higher than a second current limit level based on the input voltage being the high voltage.

In an embodiment, the setting of the protection level may include setting, by the at least one processor, the overvoltage protection level to a first overvoltage protection level based on the input voltage being the low voltage, and setting, by the at least one processor, the undervoltage protection level to a first undervoltage protection level based on the input voltage being the low voltage. The first overvoltage protection level may be lower than a second overvoltage protection level based on the input voltage being the high voltage. The first undervoltage protection level may be lower than a second undervoltage protection level based on the input voltage being the high voltage.

In an embodiment, the setting of the protection level may include setting, by the at least one processor, the input current limit level to a first current limit level based on the input voltage being the low voltage. The first current limit level may be higher than a second current limit level based on the input voltage being the high voltage.

In an embodiment, the method may further include controlling, by the at least one processor, based on the input voltage being the low voltage, an operation of the power factor correction circuit such that a first DC link maximum boost level of the power factor correction circuit may be equal to a second DC link maximum boost level when the input voltage is the high voltage.

In an embodiment, the setting of the protection level may include receiving a voltage command based on an operation of a load of the electrical device, and increasing, based on the voltage command and the input voltage being the low voltage, an overvoltage protection level together with a DC link voltage of the power factor correction circuit.

In an embodiment, the setting of the protection level may include controlling, based on the input voltage being the low voltage, an operation of the power factor correction circuit to start boosting the DC link voltage to a first voltage. The first voltage may be lower than a second voltage of the DC link voltage when the input voltage is the high voltage.

In an embodiment, the setting of the protection level may include detecting a rising slope of the DC link voltage, and turning off a relay based on the rising slope of the DC link voltage being greater than or equal to a preset reference value. The relay may be disposed in front of the power factor correction circuit.

Additional aspects may be set forth in part in the description which follows and, in part, may be apparent from the description, and/or may be learned by practice of the presented embodiments.

BRIEF DESCRIPTION OF THE DRAWINGS

The above and other aspects, features, and advantages of certain embodiments of the present disclosure may be more apparent from the following description taken in conjunction with the accompanying drawings, in which.

DETAILED DESCRIPTION

Figure 1:
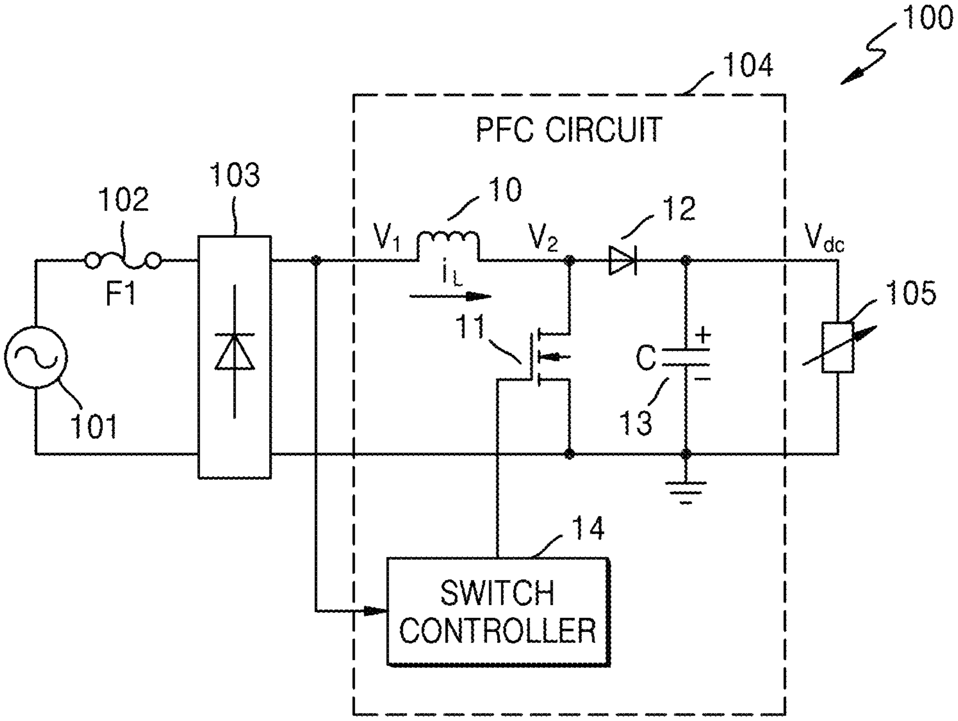
FIG. 1 is a circuit diagram of an electrical device including a power factor correction circuit (PFC), according to an embodiment.

The following description with reference to the accompanying drawings is provided to assist in a comprehensive understanding of embodiments of the present disclosure defined by the claims and their equivalents. Various specific details are included to assist in understanding, but these details may be considered to be exemplary only. Therefore, those of ordinary skill in the art may recognize that various changes and modifications of the embodiments described herein may be made without departing from the scope and spirit of the disclosure. In addition, descriptions of well-known functions and structures may be omitted for clarity and conciseness.

Terms used in the disclosure may be briefly described, and an embodiment of the disclosure may be described in detail.

Throughout the disclosure, the expression "at least one of a, b or c" may indicate only a, only b, only c, both a and b, both a and c, both b and c, all of a, b, and c, or variations thereof.

Although general terms being currently widely used were selected as terminology used in the disclosure while considering the functions in an embodiment of the disclosure, they may vary according to intentions of one of ordinary skill in the art, judicial precedents, the advent of new technologies, and the like. Also, terms arbitrarily selected by the applicant may also be used in a specific case. In this case, their meanings may be described in the detailed description of the disclosure. Hence, the terms used in the disclosure may be defined based on the meanings of the terms and the entire content of the disclosure, not by simply stating the terms themselves.

Also, in the entire disclosure, it may be understood that when a certain part "includes" a certain component, the part may not exclude another component but may further include another component, unless the context clearly dictates otherwise. The terms "portion", "part", "module", and the like used in the disclosure may refer to a unit used to process at least one function and/or operation, and may be implemented by hardware, software, or a combination thereof.

Hereinafter, an embodiment of the disclosure may be described with reference to the accompanying drawings so that one of ordinary skill in the technical art to which the disclosure pertains may carry out the embodiment. However, the embodiment of the disclosure may be implemented in different forms, without being limited to the embodiment described herein. In the drawings, parts that may be irrelevant to the descriptions may be not shown in order to clearly describe the embodiment of the disclosure. Throughout the entire disclosure, similar parts may be assigned similar reference numerals.

It is to be understood that a singular form of a noun corresponding to an item may include one or more of the things, unless the relevant context clearly indicates otherwise. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wired), wirelessly, or via a third element.

Reference throughout the present disclosure to "one embodiment," "an embodiment," "an example embodiment," or similar language may indicate that a particular feature, structure, or characteristic described in connection with the indicated embodiment is included in at least one embodiment of the present solution. Thus, the phrases "in one embodiment", "in an embodiment," "in an example embodiment," and similar language throughout this disclosure may, but do not necessarily, all refer to the same embodiment. The embodiments described herein are example embodiments, and thus, the disclosure is not limited thereto and may be realized in various other forms.

It is to be understood that the specific order or hierarchy of blocks in the processes/flowcharts disclosed are an illustration of exemplary approaches. Based upon design preferences, it is understood that the specific order or hierarchy of blocks in the processes/flowcharts may be rearranged. Further, some blocks may be combined or omitted. The accompanying claims present elements of the various blocks in a sample order, and are not meant to be limited to the specific order or hierarchy presented.

The embodiments herein may be described and illustrated in terms of blocks, as shown in the drawings, which carry out a described function or functions. These blocks, which may be referred to herein as units or modules or the like, or by names such as device, logic, circuit, controller, counter, comparator, generator, converter, or the like, may be physically implemented by analog and/or digital circuits including one or more of a logic gate, an integrated circuit, a microprocessor, a microcontroller, a memory circuit, a passive electronic component, an active electronic component, an optical component, and the like.

In the present disclosure, the articles "a" and "an" are intended to include one or more items, and may be used interchangeably with "one or more." Where only one item is intended, the term "one" or similar language is used. For example, the term "a processor" may refer to either a single processor or multiple processors. When a processor is described as carrying out an operation and the processor is referred to perform an additional operation, the multiple operations may be executed by either a single processor or any one or a combination of multiple processors.

Hereinafter, various embodiments of the present disclosure are described with reference to the accompanying drawings.

According to an embodiment, an electrical device capable of protecting an element by actively changing a protection level of a power factor correction (PFC) circuit based on an input voltage, and a method for controlling the electrical device may be provided.

According to an embodiment, an electrical device capable of potentially improving efficiency degradation due to conduction losses at a low input voltage by actively changing a direct current (DC) link voltage of a PFC circuit based on an input voltage, and a method for controlling the electrical device may be provided.

FIG. 1 is a circuit diagram of an electrical device 100 including a power factor correction circuit.

The electrical device 100 shown in FIG. 1 may include an input power source 101, a fuse 102, a bridge diode 103, a PFC circuit 104, and a load 105, although the present disclosure is not limited thereto. For example, the electrical device 100 may further include at least one processor (e.g., processor 303, 902, 1201, or 1420 as described with reference to FIGS. 3, 9, 12, and 14, respectively). The at least one processor may be a component for controlling functions of the electrical device 100 and may be configured as a microcomputer for data communication (Micom™). As another example, the electrical device 100 may further include a relay 901 and an electro-magnetic interference (EMI) filter 1411, as described with reference to FIGS. 9 and 14, respectively, between the fuse 102 and the bridge diode 103. The relay 901 of FIG. 9 may be a component that is controlled by the at least one processor 902, separately from the fuse 102, and protects a circuit element from input power or inrush current. The EMI filter 1411 of FIG. 14 may be a component that removes high-frequency noise applied from the input power source 101.

The input power source 101, as shown in FIG. 1, may be an alternating current (AC) power source having a low voltage, a high voltage, or a voltage according to universal standards. For example, the low voltage may include 110 $V_{ac}$±10% or 127 $V_{ac}$, although the present disclosure is not limited thereto. An AC voltage of 110 $V_{ac}$ described below is an example of a low voltage in an embodiment and may be replaced with a low voltage of another value. The high voltage may include 220 $V_{ac}$±10% or 230 $V_{ac}$, although the present disclosure is not limited thereto. The AC voltage of 220 $V_{ac}$ described below is an example of a high voltage in an embodiment and may be replaced with a high voltage of another value. The voltage according to the universal standards may range from 85 $V_{ac}$ to 265 $V_{ac}$, although the present disclosure is not limited thereto.

The input power source 101 may be an alternating current power source through a power line connected to a power outlet. The input power source 101 may be a receiver that receives alternating current power wirelessly from a station according to wireless power transmission.

The fuse 102, as shown in FIG. 1, may be a safety device that protects a circuit located behind the fuse by being disconnected when a magnitude of input current provided from the input power source 101 reaches a limit value or more. The bridge diode 103 may be a component that rectifies an input alternating current voltage, and may function to convert an alternating current voltage input through the fuse 102 into a direct current (DC) voltage. Accordingly, the bridge diode 103 may also be referred to as a rectifier.

Because the PFC circuit 104, as shown in FIG. 1, generates an output voltage $V_{ac}$ by boosting a direction current voltage $V_1$ transmitted from the bridge diode 103, the PFC circuit 104 may also be referred to as a boost converter. The output voltage $V_{ac}$ may be a voltage across both terminals of a capacitor 13, and may also be referred to as a DC link voltage. The PFC circuit 104 may secure operating performance of the load 105 even when a low voltage is applied from the input power source 101 by setting a maximum DC link voltage level when a voltage of the input power source 101 is 110 $V_{ac}$ to be equal to a maximum DC link voltage level when a voltage of the input power source 101 is 220 $V_{ac}$. For example, securing the operating performance of the load 105 in the case in which the load 105 is a compressor motor of an outdoor unit of an air conditioner may result in the performance of the compressor motor being secured even when a low voltage is applied. That the performance of the motor is secured may refer to a required voltage of the motor based on an operation of the motor corresponding to a DC link voltage provided to the load 105.

Figure 2:
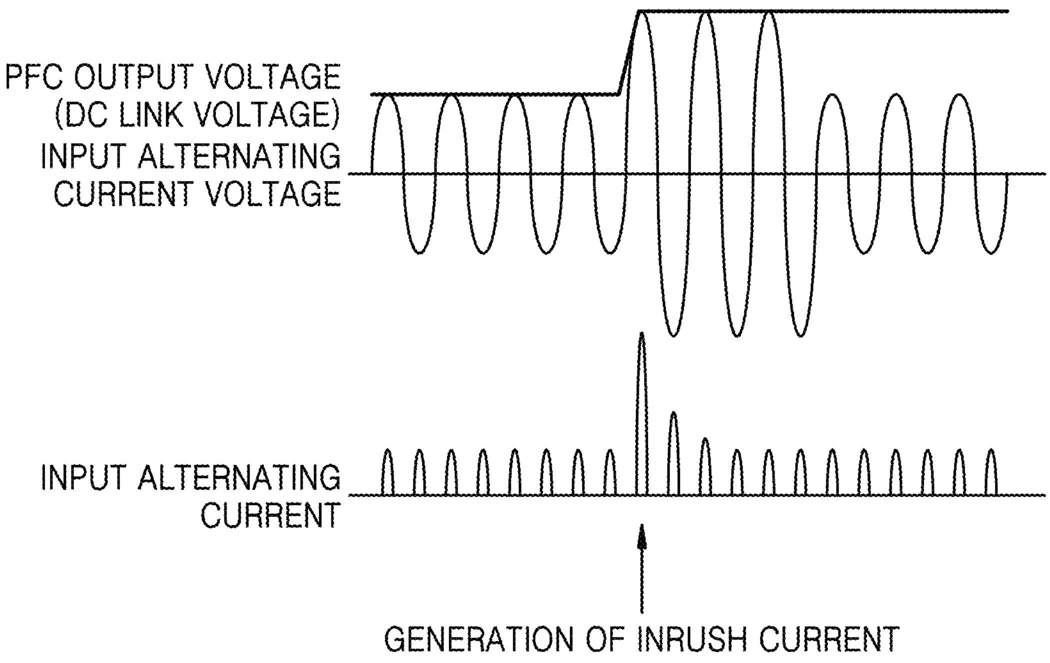
FIG. 2 is an example diagram showing a relationship between an output voltage of a PFC circuit and an inrush current, when an input alternating current voltage applied as input power increases while an electrical device operates, according to an embodiment.

FIG. 2 is an example diagram showing relationship between an output voltage $V_{ac}$ of the PFC circuit 104 and inrush current when an input alternating current voltage applied as input power increases while the electrical device 100 operates. Inrush current may be generated in input alternating current when an input alternating current voltage applied from the input power source 101 changes sharply. For example, when an input alternating current voltage applied from the input power source 101 abruptly changes from a low voltage to a high voltage while the electrical device 100 operates, inrush current may be generated at a time as shown in FIG. 2, in order to charge the capacitor 13 included in the PFC circuit 104.

By controlling a turn-on or turn-off cycle of a switch 11 included in the PFC circuit 104 based on a protection level of the PFC circuit 104, the switch 11 and the capacitor 13 included in the PFC circuit 104 may be protected against inrush current generated as shown in FIG. 2, and the electrical device 100 may potentially prevent damage to the fuse 102 or the bridge diode 103 which is a surrounding component of the PFC circuit 104, the relay 901, or the EMI filter 1411. Controlling the turn-on or turn-off cycle of the switch 11 may include changing a turn-on or turn-off cycle of the switch 11.

A component included in the electrical device 100 may be referred to as an element. For example, the fuse 102 and the bridge diode 103 shown in FIG. 1 may be referred to as elements. An inductor 10, the switch 11, a diode 12, and the capacitor 13 included in the PFC circuit 104 may be referred to as elements.

In regard to the PFC circuit 104 shown in FIG. 1, an input voltage $V_1$ may be referred to as a primary DC voltage, and an output voltage $V_{ac}$ may be referred to as a secondary DC voltage. The PFC circuit 104 may potentially improve a power factor of the electrical device 100 by detecting a phase of the primary DC voltage $V_1$ and controlling a phase difference between a voltage and current to be 0 (zero). A power factor may represent a ratio of power (effective power) effectively acting on the load 105 with respect to power (apparent power) transferred from the input power source 101. Therefore, a low power factor indicates low energy efficiency of the electrical device 100, and a high power factor indicates high energy efficiency of the electrical device 100.

The PFC circuit 104 may include the inductor (or reactor) 10, the switch 11, the diode 12, the capacitor 13, and a switch controller 14. However, the PFC circuit 104 is not limited thereto. One end of the inductor 10 may be connected to an output terminal of the bridge diode 103, and another end of the inductor 10 may be connected to an anode of the diode 12. A cathode of the diode 12 may be connected to a terminal of the capacitor 13, and another terminal of the capacitor 13 may be connected to a ground. A drain terminal of the switch 11 may be connected to a node between the inductor 10 and the diode D, a source terminal of the switch 11 may be connected to the ground, and a gate terminal of the switch 11 may be connected to an output terminal of the switch controller 14. In FIG. 1, the switch 11 is configured as a metal oxide semiconductor field effect transistor (MOSFET), although the present disclosure is not limited thereto. However, the switch 11 may be another switching element such as, but not limited to, a bipolar junction transistor (BJT).

The PFC circuit 104 may control a turn-on or turn-off cycle of the switch 11 by a control signal transmitted from the switch controller 14 to generate a boosted output voltage $V_{dc}$ from a voltage $V_2$ input to the capacitor 13, while potentially preventing damage to the switch 11 and the capacitor 13 due to application of an overvoltage. The output voltage $V_{ac}$ may be maximally between 360 $V_{ac}$ and 400 $V_{dc}$, although the present disclosure is not limited thereto.

In the PFC circuit 104, when the switch 11 is turned on, a voltage $V_1$ applied to the inductor 10 may become substantially similar and/or the same as an output voltage $V_2$ of the inductor 10 and no current may flow to the diode 12. Accordingly, energy may be accumulated in the inductor 10. In the PFC circuit 104, when the switch 11 is turned off, current of the inductor 10 may flow to the capacitor 13 via the diode 12, and a boosted output voltage $V_{dc}$ may be provided to the load 105. At this time, a voltage of the inductor 10 may become $V_1$-$V_{ac}$, resulting in a minus (negative) voltage. The PFC circuit 104 may improve a power factor by controlling turn-on and turn-off operations of the switch 11 such that an average of voltages across the inductor 10 becomes 0 (zero) during one cycle of the switch 11 being turned on and then off. Controlling the turn-on and turn-off operations of the switch 11 may include changing a turn-on and turn-off cycle of the switch 11.

Based on a protection level of the PFC circuit 104 set according to an embodiment, a turn-on or turn-off cycle of the switch 11 may be controlled by the switch controller 14 included in the PFC circuit 104. The protection level of the PFC circuit 104 may include at least one or all of an overvoltage protection level, an undervoltage protection level, or an input current limit level, although the present disclosure is not limited thereto. For example, the protection level of the PFC circuit 104 may include an overvoltage protection level. For example, the protection level of the PFC circuit 104 may include an undervoltage protection level. For example, the protection level of the PFC circuit 104 may include an input current limit level. For example, the protection level of the PFC circuit 104 may include an overvoltage protection level and an undervoltage protection level. For example, the protection level of the PFC circuit 104 may include an overvoltage protection level and an input current limit level. For example, the protection level of the PFC circuit 104 may include an undervoltage protection level and an input current limit level. For example, the protection level of the PFC circuit 104 may include an overvoltage protection level, an undervoltage protection level, and an input current limit level. The protection level of the PFC circuit 104 may be configured to potentially prevent damage to components included in the electrical device 100 against inrush current that may be generated in a poor power supply environment. The protection level of the PFC circuit 104 may be configured to potentially prevent damage to the components included in the electrical device 100 against an overvoltage that may be generated in a poor power supply environment. The protection level of the PFC circuit 104 may be configured to potentially prevent damage to the components included in the electrical device 100 against inrush current and an overvoltage that may be generated in a poor power supply environment.

The overvoltage protection level may be set based on a maximum voltage that the components included in the electrical device 100 may withstand. For example, when the input power source 101 is a low voltage, the overvoltage protection level may change based on a DC link boost command voltage according to an operation of the load 105. The switch controller 14 may be configured to control an operation of the switch 11 based on input current of the PFC circuit 104. However, the switch controller 14 may be configured to receive a DC link boost command voltage through another side. The switch controller 14 may be configured to receive an input voltage of the PFC circuit 104. The DC link boost command voltage may be based on a motor required voltage depending on operating speed of a motor included in the load 105. The undervoltage protection level may be set to potentially prevent damage to the components included in the electrical device 100 against inrush current. The input current limit level may be set to maintain a maximum of an output voltage $V_{ac}$ of the PFC circuit 104 within an allowable current range of elements.

The overvoltage protection level, the undervoltage protection level, and/or the input current limit level may be set differently depending on whether power applied to the input power source 101 is a low voltage or a high voltage. The overvoltage protection level, the undervoltage protection level, and/or the input current limit level may be set in consideration of a voltage variation range per hour in a poor power supply region where rapid variations in voltage may occur while the electrical device 100 operates.

The load 105 may secure operating performance by the boosted output voltage $V_{ac}$ of the PFC circuit 104 even when the input power source 101 is a low voltage. The load 105 may be a compressor motor or a fan motor included in an outdoor unit of an air conditioner, although the present disclosure is not limited thereto. For example, the load 105 may include a battery charger or a standard charging for charging a battery of an electric vehicle, a fan motor or a compressor motor of a refrigerator, a motor of a washing machine, or a motor of a cleaner. Securing the operating performance may refer to providing a voltage required to operate the load 105.

The load 105 shown may need to use a component with a sufficiently large margin in consideration of a variation range because the input power source 101 may apply both 110 $V_{ac}$ and 220 $V_{ac}$. However, because a protection level of the PFC circuit 104 changes depending on a voltage of power applied through the input power source 101, a component with a large margin in consideration of the variation range of the input power source 101 may not need to be used. Accordingly, it may be possible to potentially prevent the size of the electrical device 100 from increasing or the manufacturing cost of the electrical device 100 from increasing due to the load 105.

The electrical device 100 may be an electronic product including the PFC circuit 104, such as, but not limited to, an outdoor unit of an air conditioner, an electric vehicle, a refrigerator, a home appliance, a power control device, or an AC/DC power supply, or the like, although the present disclosure is not limited thereto. For example, the electrical device 100 may include, but not be limited to, an air conditioner, a washing machine, a dryer, a lamp, a television (TV), a heater, a cleaner, or a styler. The heater may include a smart kettle, an induction device, an air fryer, a rice cooker, or the like, although the present disclosure is not limited thereto.

Figure 3:
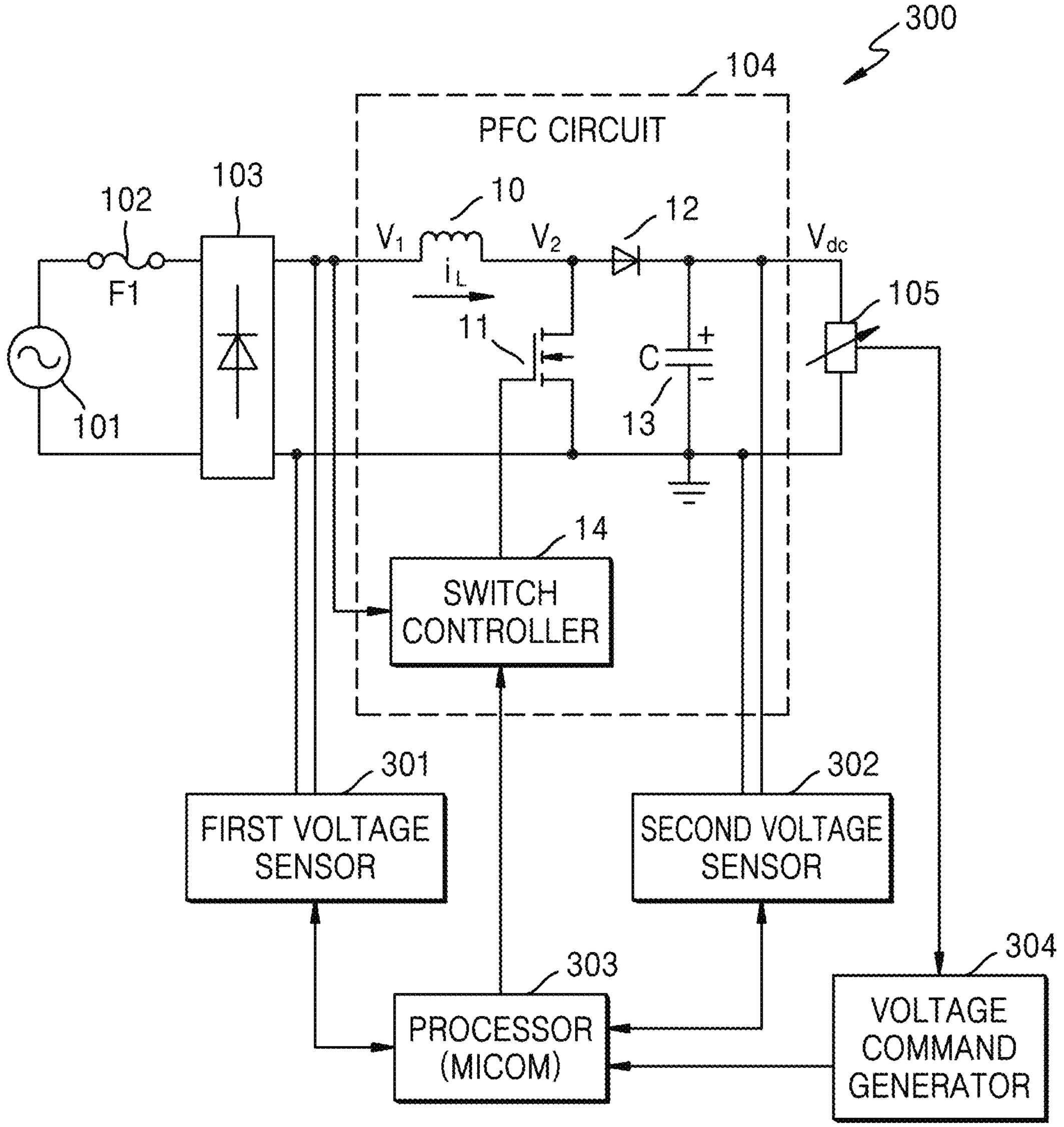
FIG. 3 is a block diagram of an electrical device, according to an embodiment.

FIG. 3 is a block diagram of an electrical device 300, according to an embodiment.

The electrical device 300 shown in FIG. 3 may include the input power source 101, the fuse 102, the bridge diode 103, the PFC circuit 104, the load 105, a first voltage sensor 301, a second voltage sensor 302, the processor 303, and a voltage command generator 304, although the present disclosure is not limited thereto. For example, the electrical device 300 may further include the relay 901 and the EMI filter 1411.

The input power source 101 may be an alternating current (AC) power source having a low voltage, a high voltage, or a voltage according to universal standards. For example, the low voltage may include 110 $V_{ac}$±10% or 127 $V_{ac}$, although the present disclosure is not limited thereto. The AC voltage 110 $V_{ac}$ described below is an example of a low voltage in an embodiment and may be replaced with a low voltage of another value. The high voltage may include 220 $V_{ac}$±10% or 230 $V_{ac}$, although the present disclosure is not limited thereto. The AC voltage 220 $V_{ac}$ described below is an example of a high voltage in an embodiment and may be replaced with a high voltage of another value. The voltage, according to the universal standards, may range from 85 $V_{ac}$ to 265 $V_{ac}$, although the present disclosure is not limited thereto.

The input power source 101 may be an alternating current power source through a power line connected to a power outlet. The input power source 101 may be a receiver that receives alternating current power wirelessly from a station according to wireless power transmission.

The fuse 102 may be a safety device that protects a circuit downstream by automatically disconnecting the circuit when a magnitude of input current provided from the input power source 101 reaches a limit value or more. The bridge diode 103 may be a component that acts as a rectifier to convert an alternating current voltage input through the fuse 102 into a direct current (DC) voltage. Accordingly, the bridge diode 103 may also be referred to as a rectifier.

Because the PFC circuit 104 generates an output voltage $V_{ac}$ by boosting a DC voltage $V_1$ transmitted from the bridge diode 103, the PFC circuit 104 may also be referred to as a boost converter. The output voltage $V_{dc}$ may be a voltage across both terminals of the capacitor 13, and may also be referred to as a DC link voltage. The PFC circuit 104 may secure operating performance of the load 105 even when a low voltage is applied from the input power source 101, in a poor power supply region, by setting maximum DC link voltage information when a voltage of the input power source 101 is the low voltage (e.g., 110 $V_{ac}$) to be the same as maximum DC link voltage information when a voltage of the input power source 101 is the high voltage (e.g., 220 $V_{ac}$). The maximum DC link voltage information may also be referred to as a maximum DC link voltage level or a maximum DC link voltage value. For example, securing operating performance of the load 105 in the case in which the load 105 is a compressor motor of an outdoor unit of an air conditioner may refer to the performance of the compressor motor being secured even when a low voltage is applied. That the performance of the motor is secured may refer to the motor required voltage based on an operation of the motor corresponding to a DC link voltage provided to the load 105. For example, in the case in which the load 105 is a battery charger or a standard charging for charging a battery of an electric vehicle, securing the operating performance of the load 105 may refer to a required operation voltage based on an operation of the battery charger or the standard charging corresponding to a DC link voltage provided to the load 105 even when a low voltage is applied.

The first voltage sensor 301 may sense an input voltage $V_1$ of the PFC circuit 104. Sensing the input voltage $V_1$ of the PFC circuit 104 may be referred to as sensing input voltage information or an input voltage value of the PFC circuit 104. The first voltage sensor 301 may be configured with a resistor or a capacitor, although the present disclosure is not limited thereto.

The second voltage sensor 302 may sense an output voltage $V_{ac}$ of the PFC circuit 104. Sensing the output voltage $V_{ac}$ of the PFC circuit 104 may be referred to as sensing output voltage information, an output voltage value, DC link voltage information, or a DC link voltage value of the PFC circuit 104. The second voltage sensor 302 may be configured with a resistor or a capacitor, although the present disclosure is not limited thereto.

The processor 303 may read voltage information sensed by the first voltage sensor 301 and the second voltage 302. The processor 303 may receive voltage information sensed by the first voltage sensor 301 and the second voltage 302. The voltage information read from the first voltage sensor 301 may also be referred to as first voltage information. The first voltage information may also be referred to as input voltage information, an input voltage value, or an input voltage. The voltage information read from the second voltage sensor 302 may also be referred to as second voltage information. The second voltage information may also be referred to as an output voltage, output voltage information, a DC link voltage, or DC link voltage information.

The processor 303 may obtain input voltage information based on the first voltage information and the second voltage information. The processor 303 may compare the first voltage information with the second voltage information, and when the first voltage information is the same as the second voltage information, the processor 303 may obtain the same information as input voltage information. The processor 303 may compare the first voltage information with the second voltage information, and when the first voltage information is different from the second voltage information, the processor 303 may obtain the first voltage information as input voltage information.

For example, according to the first voltage information being 110 $V_{ac}$ (or 127 $V_{ac}$) and the second voltage information being 110 $V_{ac}$ (or 127 $V_{ac}$), the processor 303 may obtain 110 $V_{ac}$ (or 127 $V_{ac}$) as input voltage information. For example, according to the first voltage information being 110 $V_{ac}$ (or 127 $V_{ac}$) and the second voltage information being 130 $V_{ac}$ (or 147 $V_{ac}$), the processor 303 may obtain 110 $V_{ac}$ (or 127 $V_{ac}$) as input voltage information. The second voltage information of 130 $V_{ac}$ (or 146 $V_{ac}$) may be due to boosting by the PFC circuit 104. According to the first voltage information being 220 $V_{ac}$ (or 230 $V_{ac}$) and the second voltage information being 220 $V_{ac}$ (or 230 $V_{ac}$), the processor 303 may obtain 220 $V_{ac}$ (or 230 $V_{ac}$) as input voltage information. For example, according to the first voltage information being 220 $V_{ac}$ (or 230 $V_{ac}$) and the second voltage information being 235 $V_{ac}$ (or 245 $V_{ac}$), the processor 303 may obtain 220 $V_{ac}$ (or 230 $V_{ac}$) as input voltage information. The second voltage information of 235 $V_{ac}$ (or 245 $V_{ac}$) may be due to boosting by the PFC circuit 104.

After the processor 303 obtains the input voltage information, the processor 303 may compare the obtained input voltage information with preset reference voltage information to determine whether the input voltage is a low voltage or a high voltage. The preset reference voltage information may be referred to as reference information for determining whether an input voltage is a low voltage or a high voltage based on a variation range of the input voltage. The preset reference voltage information may be stored in the processor 303 or a memory 1470 of FIG. 14. The memory 1470 may be included in the electrical device 300. In the case in which the reference voltage information is stored in the memory 1470, the processor 303 may read the reference voltage information from the memory 1470 and use the reference voltage information. For example, the preset reference voltage information may be set to 165 $V_{ac}$, although the present disclosure is not limited thereto.

According to the obtained input voltage information being 165 $V_{ac}$ or less, the processor 303 may determine the input voltage applied from the input power source 101 to be a low voltage. According to the obtained input voltage information exceeding 165 $V_{ac}$, the processor 303 may determine the input voltage applied from the input power source 101 to be a high voltage. After the processor 303 determines the input voltage to be a low voltage or a high voltage, the processor 303 may re-determine whether the input voltage is a low voltage or a high voltage.

To potentially prevent a situation of continuing to monitor input voltage information when the input voltage information is re-determined, the processor 303 may apply hysteresis. For example, the processor 303 may potentially prevent re-determination due to voltage fluctuations through hysteresis of about 30 $V_{ac}$ based on a previously determined voltage. For example, when input voltage information obtained after an input voltage applied from the input power source 101 is determined to be a low voltage of 110 $V_{ac}$ is 180 $V_{ac}$ or more, the processor 303 may determine an input voltage applied from the input power source 101 to be a high voltage of 220 $V_{ac}$. For example, when input voltage information obtained after an input voltage applied from the input power source 101 is determined to be a high voltage of 220 $V_{ac}$ is 150 $V_{ac}$ or less, the processor 303 may determine an input voltage applied from the input power source 101 to be a low voltage of 110 $V_{ac}$.

After the processor 303 determines whether the input voltage applied from the input power source 101 is a low voltage or a high voltage, the processor 303 may set a protection level of the PFC circuit 104 based on the determined input voltage. The protection level may include at least one or all of an overvoltage protection level, an undervoltage protection level, or an input current limit level, although the present disclosure is not limited thereto. For example, the processor 303 may set an overvoltage protection level of the PFC circuit 104. For example, the processor 303 may set an undervoltage protection level of the PFC circuit 104. For example, the processor 303 may set an input current limit level of the PFC circuit 104. For example, the processor 303 may set an overvoltage protection level and an undervoltage protection level of the PFC circuit 104. For example, the processor 303 may set an overvoltage protection level and an input current limit level of the PFC circuit 104. For example, the processor 303 may set an undervoltage protection level and an input current limit level of the PFC circuit 104.

As another example, the processor 303 may set an overvoltage protection level and an undervoltage protection level when a determined input voltage is a low voltage to be lower than an overvoltage protection level and an undervoltage protection level when an input voltage is a high voltage. The overvoltage protection level may also be referred to as an overvoltage level, an overvoltage protection value, or an overvoltage value. The undervoltage protection level may also be referred to as an undervoltage level, an undervoltage protection value, or an undervoltage value. The processor 303 may set an input current limit level when an input voltage is a low voltage to be higher than an input current limit level when an input voltage is a high voltage. The input current limit level may also be referred to as an input current limit value or an input current level.

For example, when an input voltage applied from the input power source 101 is a low voltage of 110 $V_{ac}$, the processor 303 may set an undervoltage protection level of the PFC circuit 104 to 65 $V_{ac}$, an overvoltage protection level of the PFC circuit 104 to 210 $V_{ac}$, and an input current limit level of the PFC circuit 104 to 30A, although the present disclosure is not limited thereto. For example, when an input voltage applied from the input power source 101 is a high voltage of 220 $V_{ac}$, the processor 303 may set an undervoltage protection level of the PFC circuit 104 to 140 $V_{ac}$, an overvoltage protection level of the PFC circuit 104 to 270 $V_{ac}$, and an input current limit level of the PFC circuit 104 to 25A, although the present disclosure is not limited thereto. As such, by setting, by the processor 303, at least one of an overvoltage protection level, an undervoltage protection level, or an input current limit level depending on an input voltage applied from the input power source 101, as described above, damage to the PFC circuit 104 and the components included in the electrical device 300 may potentially be prevented and/or reduced.

In order to secure performance of the load 105, the processor 303 may control a boosting operation of the PFC circuit 104 such that a DC link maximum boost level of the PFC circuit 104 when an input voltage applied from the input power source 101 is a low voltage (e.g., 110 $V_{ac}$) is equal to a DC link maximum boost level when an input voltage applied from the input power source 101 is a high voltage (e.g., 220 $V_{ac}$). Securing the performance of the load 105 may refer to supplying power to enable the load 105 to perform a desired operation at a desired speed. For example, securing the performance of the load 105 may be referred to as supplying, in the case in which the load 105 is a compressor motor of an air conditioner, power to provide performance of the compressor motor required by the air conditioner. Supplying the power to provide the required performance of the compressor motor may refer to supplying a DC link voltage to provide the required performance of the compressor motor. The required performance of the compressor motor may be referred to as a required voltage based on an operation of the compressor motor.

Figure 4:
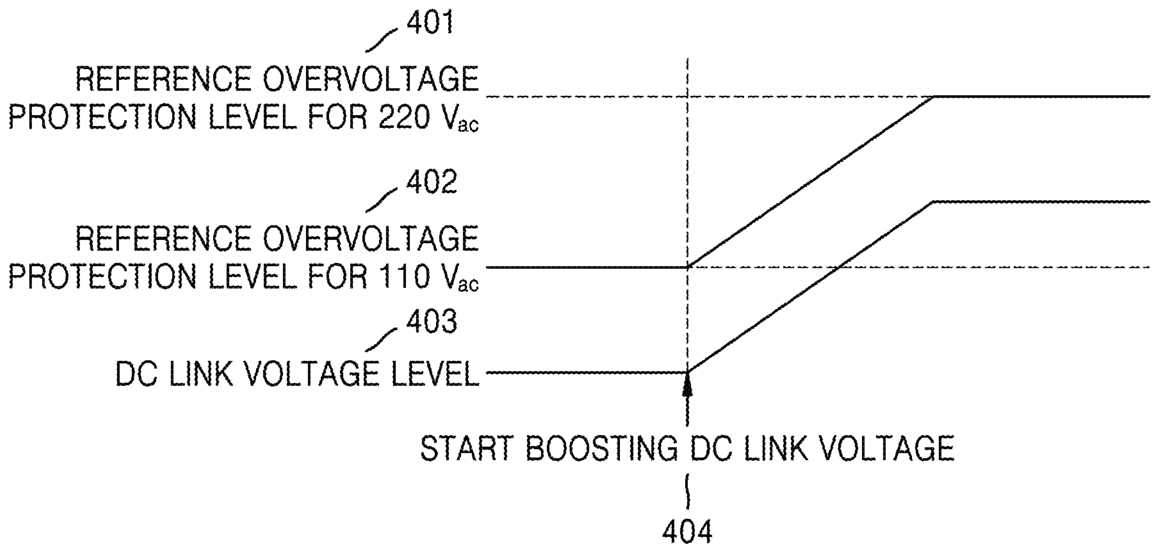
FIG. 4 is an example diagram showing changes in an overvoltage protection level of a PFC circuit and a direct current (DC) link voltage level being boosted, when input power provided from an input power source is a low voltage of 110 $V_{ac}$, according to an embodiment.

Because the processor 303 controls a DC link maximum boost level of the PFC circuit 104 when an input voltage applied from the input power source 101 is a low voltage to be equal to a DC link maximum boost level of the PFC circuit 104 when an input voltage applied from the input power source 101 is a high voltage, a DC link voltage of the PFC circuit 104 may exceed a reference overvoltage protection level for a low voltage (e.g., 110 $V_{ac}$), which may result in generation of an overvoltage error. To potentially prevent the generation of the overvoltage error, when the processor 303 boosts a DC link voltage of the PFC circuit 104 according to a voltage command provided from the voltage command generator 304, the processor 303 may perform a control of increasing an overvoltage protection level of 110 $V_{ac}$ together, as shown in FIG. 4. A maximum increase value of the overvoltage protection level may be limited to a reference overvoltage protection level for a high voltage of 220 $V_{ac}$ set based on specifications of the capacitor 13 and/or the switch 11, as shown in FIG. 4.

FIG. 4 is an example diagram showing changes in an overvoltage protection level of the PFC circuit 104 and a DC link voltage level being boosted, when input power provided from the input power source 101 is a low voltage of 110 $V_{ac}$, according to an embodiment. As shown in FIG. 4, an overvoltage protection level for a low voltage of 110 $V_{ac}$ may increase at the same rate as a DC link voltage level from a time at which the DC link voltage starts being boosted, and a maximum value of the overvoltage protection level for the low voltage of 110 $V_{ac}$ may correspond to a reference overvoltage protection level for a high voltage of 220 $V_{ac}$.

For example, when an input voltage applied from the input power source 101 is a high voltage of 220 $V_{ac}$ and a DC link voltage is boosted up to a maximum of 360 $V_{ac}$, a DC link voltage for a low voltage of 110 $V_{ac}$ may be set to be boosted up to the maximum of 360 $V_{dc}$. Accordingly, when a reference overvoltage level for a low voltage of 110 $V_{ac}$ is 210 $V_{ac}$ (297 $V_{dc}$), the DC link maximum voltage level of 360 $V_{ac}$ through boosting by the PFC circuit 104 may be higher than the reference overvoltage protection level of 297 $V_{dc}$, and therefore, an overvoltage error may be generated. To potentially prevent the generation of such an overvoltage error, an overvoltage level may be controlled to increase together with a DC link voltage being boosted. The processor 303 may increase an overvoltage level of the PFC circuit 104 in proportion to a DC link voltage of the PFC circuit 104. An overvoltage protection level for a high voltage of 220 $V_{ac}$ may be 380 $V_{ac}$, although the present disclosure is not limited thereto. For example, an overvoltage protection level for 220 $V_{ac}$ may be set to 400 $V_{dc}$.

To compensate for low operating efficiency of the load 105 due to an increase in current at a low input voltage of 110 $V_{ac}$ applied from the input power source 101 compared to a high input voltage of 220 $V_{ac}$, the processor 303 may set a voltage value at which a DC link voltage for a low voltage of 110 $V_{ac}$ starts being boosted to be lower than a voltage value at which a DC link voltage for a high voltage of 220 $V_{ac}$ starts being boosted. Accordingly, the operating efficiency of the load 105 may increase even when an input voltage applied from the input power source 101 is a low voltage. Increasing the operating efficiency of the load 105 may refer to potentially improving the performance of the load 105 as described above.

Figure 5:
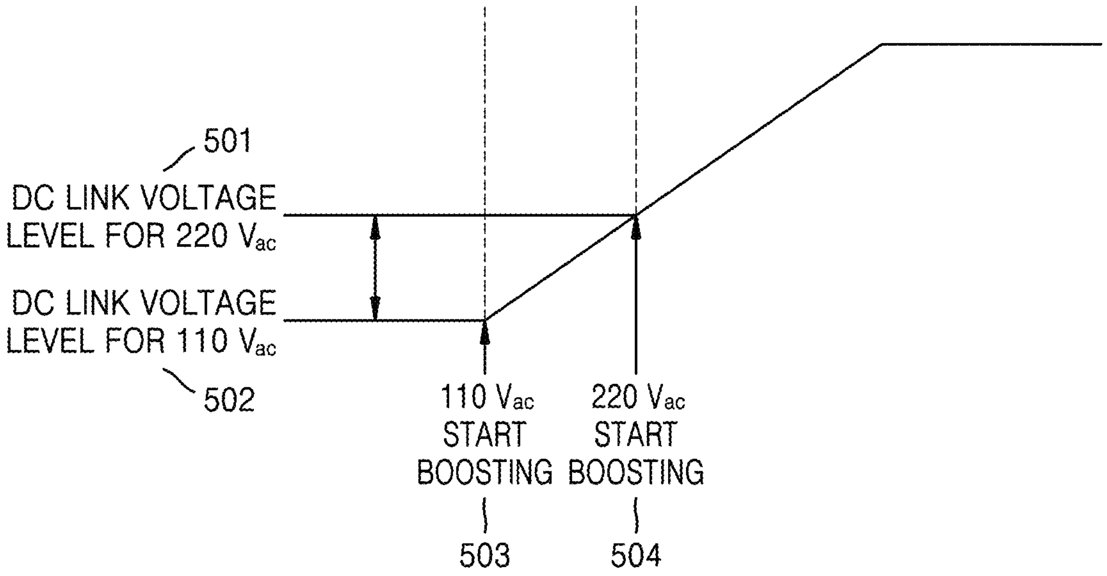
FIG. 5 is an example diagram showing boosting of a DC link voltage for improving efficiency in a low-load condition when an input voltage is a low voltage, according to an embodiment.

FIG. 5 is an example diagram showing boosting of a DC link voltage for improving efficiency in a low-load condition when an input voltage is a low voltage, according to an embodiment.

For example, when an input voltage applied from the input power source 101 is a high voltage (e.g., 220 $V_{ac}$), boosting may start at 311 $V_{ac}$ or more, whereas, in the case of a low voltage (e.g., 100 $V_{ac}$), boosting may start at 155 $V_{dc}$ or more. Accordingly, at a low voltage of 110 $V_{ac}$, the PFC circuit 104 may use a boosting voltage within a range of 155 $V_{dc}$ to 311 $V_{ac}$. As such, by lowering a boosting voltage at an area where the load 105 is low, switching loss may be lowered, which may result in an improvement of performance efficiency of the load 105. Improving the performance efficiency of the load 105 may refer to supplying required power of the load 105. Although, in a high-speed area where the required power of the load 105 is high, efficiency may be lower than that of 220 $V_{ac}$, the operating efficiency of the load 105 in a low-speed area where the required voltage of the load 105 is low may be improved.

The voltage command generator 304 of FIG. 3 may generate a voltage command determined according to a required voltage of the load 105 and may transmit the generated voltage command to the processor 303. For example, in the case in which the load 105 is a motor, a required voltage may be referred to as a motor required voltage. Hereinafter, a motor required voltage may refer to a required voltage based on an operation of the load 105. A voltage command generated by the low voltage command generator 304 may be referred to as a DC link command voltage of the PFC circuit 104. Accordingly, at a low voltage applied from the input power source 101, the processor 303 may change an overvoltage protection level of the PFC circuit 104 to increase the overvoltage protection level of the PFC circuit 104 according to an increase of a motor required voltage. A motor required voltage may be determined according to a D-axis voltage command and a Q-axis voltage command of a motor included in the load 105, and may be represented as an equation similar to Equation 1 below. A motor required voltage may have a low voltage value at low speed of the motor included in the load 105, and a high voltage value at high speed of the motor included in the load 105.

$$V_m = \sqrt{V_{ds}^2 + V_{qs}^2} \quad \text{[Equation 1]}$$

Referring to Equation 1, $V_m$ may represent a motor required voltage, Vas may represent a D-axis voltage command, and Vas may represent a Q-axis voltage command. A motor required voltage according to an embodiment is not limited to Equation 1.

Figure 6:
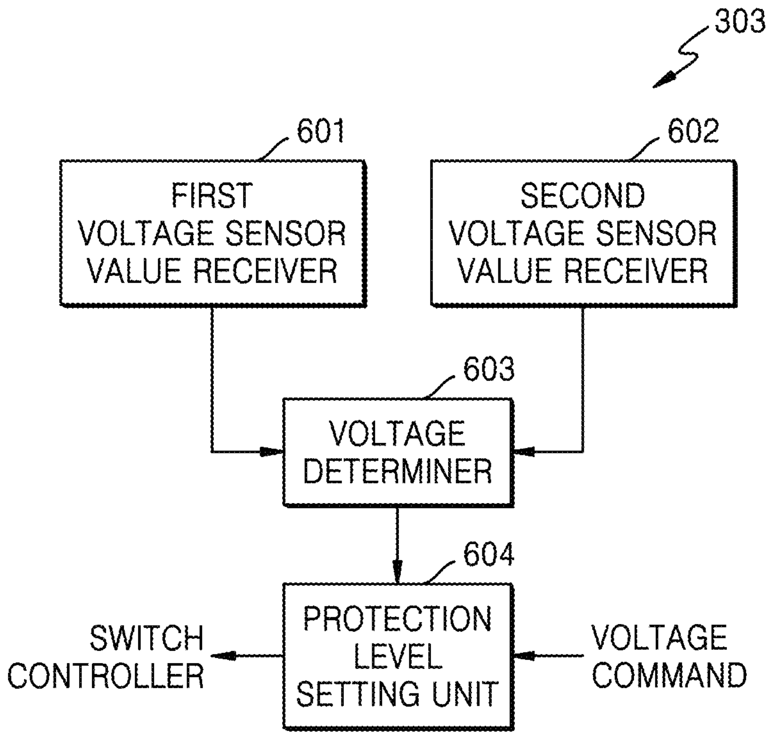
FIG. 6 is a functional block diagram of a processor, according to an embodiment.

FIG. 6 is a functional block diagram of the processor 303 according to an embodiment.

Referring to FIG. 6, the processor 303 may include a first voltage sensor value receiver 601, a second voltage sensor value receiver 602, a voltage determiner 603, and a protection level setting unit 604, although the present disclosure is not limited thereto.

The first voltage sensor value receiver 601 may be configured to read an input voltage sensed by the first voltage sensor 301. The first voltage sensor value receiver 601 may be configured to receive an input voltage sensed by the first voltage sensor 301. A configuration of the first voltage sensor value receiver 601 may depend on a configuration of the first voltage sensor 301. For example, the first voltage sensor value receiver 601 may determine a connection point to the first voltage sensor 301 depending on whether the first voltage sensor 301 is configured with a resistor or a capacitor.

The second voltage sensor value receiver 602 may be configured to read an input voltage sensed by the second voltage sensor 302. The second voltage sensor value receiver 602 may be configured to receive an input voltage sensed by the second voltage sensor 302. A configuration of the second voltage sensor value receiver 602 may depend on a configuration of the second voltage sensor 302. For example, the second voltage sensor value receiver 602 may determine a connection point to the second voltage sensor 302 depending on whether the second voltage sensor 302 is configured with a resistor or a capacitor.

The voltage determiner 603 may obtain an input voltage of the electrical device 300 based on input voltage information of the PFC circuit 104 received by the first voltage sensor value receiver 601 and DC link voltage information of the PFC circuit 104 received by the second voltage sensor value receiver 602. After the input voltage of the electrical device 300 is obtained, the voltage determiner 603 may compare the obtained input voltage with preset reference voltage information to determine whether the input voltage of the electrical device 300 is a low voltage or a high voltage. The preset reference voltage has been described with reference to FIG. 3. For example, the preset reference voltage may be 165 $V_{ac}$. The voltage determiner 603 may be referred to as a voltage judgement unit or a voltage check unit. A unit may be referred to as a processor and/or a portion of a processor (e.g., a core).

The protection level setting unit 604 may set a protection level of the PFC circuit 104 according to a voltage determined by the voltage determiner 603. The protection level of the PFC circuit 104 may include at least one or all of an overvoltage protection level, an undervoltage protection level, or an input current limit level, although the present disclosure is not limited thereto. The protection level of the PFC circuit 104 may be configured to potentially prevent damage to components included in the electrical device 300 against inrush current that may be generated in a poor power supply environment.

The overvoltage protection level may be set based on a maximum voltage that the components included in the electrical device 300 may withstand. For example, when the input power source 101 is a low voltage, the overvoltage protection level may change based on a DC link boost command voltage according to an operation of the load 105. Accordingly, although the switch controller 14 of FIG. 1 is configured to control an operation of the switch 11 based on an input voltage of the PFC circuit 104, the switch controller 14 may be configured to receive a DC link boost command voltage through another side. Controlling the operation of the switch 11 may refer to controlling an operating cycle of the switch 11. Controlling the operating cycle of the switch 11 may include changing an operating cycle of the switch 11.

The DC link boost command voltage may be based on a motor required voltage according to operating speed of the motor included in the load 105. The low voltage protection level may be set to potentially prevent damage to the components included in the electrical device 300 against inrush current. The input current limit level may be set to maintain a maximum of an output voltage $V_{ac}$ of the PFC circuit 104.

The overvoltage protection level, the undervoltage protection level, and/or the input current limit level may be set differently depending on whether power applied to the input power voltage 101 is a low voltage or a high voltage. The overvoltage protection level, the undervoltage protection level, or the input current limit level may be set differently depending on whether power applied to the input power voltage 101 is a low voltage or a high voltage. The overvoltage protection level and the undervoltage protection level may be set differently depending on whether power applied to the input power voltage 101 is a low voltage or a high voltage. The input current limit level may be set differently depending on whether power applied to the input power voltage 101 is a low voltage or a high voltage. The overvoltage protection level, the undervoltage protection level, and/or the input current limit level may be set in consideration of a voltage variation range per hour in a poor power supply region where rapid variations in voltage may occur while the electrical device 100 operates.

The protection level setting unit 604 may set a protection level of the PFC circuit 104 based on a voltage command generated according to a motor required voltage transmitted from the load 105, as described with reference to FIG. 3. The voltage command may be referred to as a DC link voltage command.

Because the protection level setting unit 604 actively changes a protection level of the PFC circuit 104 according to an input voltage applied from the input power source 101, the protection level setting unit 604 may also be referred to as a protection level changing unit.

Figure 7:
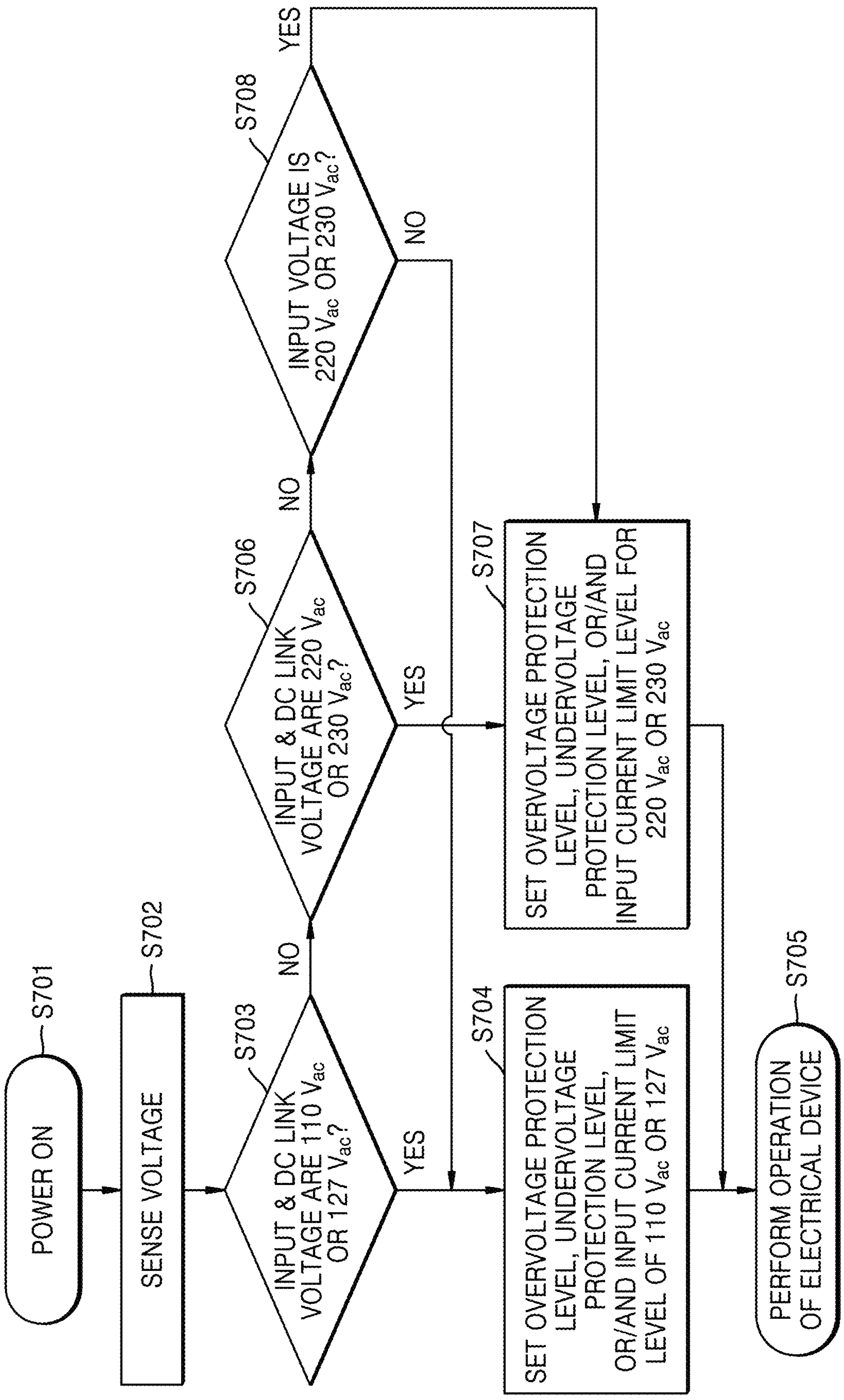
FIG. 7 is an operation flowchart illustrating an operation of setting a protection level of a PFC circuit according to an input voltage by a processor, according to an embodiment.

FIG. 7 is an operation flowchart illustrating an operation of setting a protection level of the PFC circuit 104 according to an input voltage by the processor 303, according to an embodiment.

When the electrical device 300 is powered on in operation S701, the processor 303 may sense a voltage in operation S702. Sensing the voltage in operation S702 may refer to sensing both an input voltage of the PFC circuit 104 and a DC link voltage of the PFC circuit 104 by the processor 303. Sensing the voltage in operation S702 may refer to reading and/or receiving an input voltage of the PFC circuit 104 from the first voltage sensor 301 and reading and/or receiving a DC link voltage of the PFC circuit 104 from the second voltage sensor 302, by the processor 303.

In operation S703, the processor 303 may determine whether the input voltage and the DC link voltage are low voltages of 110 $V_{ac}$ or 127 $V_{ac}$. According to the determined result that both the input voltage and the DC link voltage are low voltages of 110 $V_{ac}$ or 127 $V_{ac}$ (YES in operation S703), the processor 303 may set an overvoltage protection level, an undervoltage protection level, and/or an input current limit level of the PFC circuit 104 to a level according to a low voltage of 110 $V_{ac}$ or 127 $V_{ac}$, in operation S704, and then proceed to operation S705.

Setting the protection level in operation S704 may be referred to as changing the protection level. That is, the processor 303 may change an overvoltage protection level of the PFC circuit 104 to an undervoltage protection level in operation S704. In operation S704, the processor 303 may set an overvoltage protection level and an undervoltage protection level of the PFC circuit 104 to a level according to the low voltage of 110 $V_{ac}$ or 127 $V_{ac}$. In operation S704, the processor 303 may set an input current limit level of the PFC circuit 104 to a level according to the low voltage of 110 $V_{ac}$ or 127 $V_{ac}$. In operation S704, the processor 303 may set an overvoltage protection level of the PFC circuit 104 to a level according to the low voltage of 110 $V_{ac}$ or 127 $V_{ac}$. In operation S704, the processor 303 may set an undervoltage protection level of the PFC circuit 104 to a level according to the low voltage of 110 $V_{ac}$ or 127 $V_{ac}$.

In operation S705, the processor 303 may perform an operation of the electrical device 300 based on the set protection level. Performing the operation of the electrical device 300 may refer to performing an operation of the load 105. Performing the operation of the load 105 may refer to performing, in the case in which the load 105 is a compressor motor of an outdoor unit of an air conditioner, an operation of the compressor motor.

In operation S703, according to the determined result that the input voltage and the DC link voltage are not low voltages of 110 $V_{ac}$ or 127 $V_{ac}$ (NO in operation S703), the processor 303 may proceed to operation S706 to determine whether the input voltage and the DC link voltage are high voltages of 220 $V_{ac}$ or 230 $V_{ac}$. In operation S706, according to the determined result that the input voltage and the DC link voltage are high voltages of 220 $V_{ac}$ or 230 $V_{ac}$ (YES in operation S706), the processor 303 may set a protection level of the PFC circuit 104 to an overvoltage protection level, an undervoltage protection level, and/or an input current limit level for a high voltage of 220 $V_{ac}$ or 230 $V_{ac}$, in operation S707, and then proceed to operation S705.

In operation S707, the protection level of the PFC circuit 104 may be set to an overvoltage protection level and an undervoltage protection level for a high voltage of 220 $V_{ac}$ or 230 $V_{ac}$. In operation S707, the protection level of the PFC circuit 104 may be set to an input current limit level for a high voltage of 220 $V_{ac}$ or 230 $V_{ac}$. In operation S707, the protection level of the PFC circuit 104 may be set to an overvoltage protection level for a high voltage of 220 $V_{ac}$ or 230 $V_{ac}$. In operation S707, the protection level of the PFC circuit 104 may be set to an undervoltage protection level for a high voltage of 220 $V_{ac}$ or 230 $V_{ac}$. In operation S707, the protection level of the PFC circuit 104 may be set to an overvoltage protection level and an input current limit level for a high voltage of 220 $V_{ac}$ or 230 $V_{ac}$. In operation S707, the protection level of the PFC circuit 104 may be set to an undervoltage protection level and an input current limit level for a high voltage of 220 $V_{ac}$ or 230 $V_{ac}$.

In operation S706, according to the determined result that the input voltage and the DC link voltage are not high voltages of 220 $V_{ac}$ or 230 $V_{ac}$ (NO in operation S706), the processor 303 may determine whether the input voltage is a high voltage of 220 $V_{ac}$ or 230 $V_{ac}$, in operation S708. In operation S708, according to the determined result that the input voltage is a high voltage of 220 $V_{ac}$ or 230 $V_{ac}$ (YES in operation S708), the processor 303 may proceed to operation S707 to set a protection level of the PFC circuit 104 to an overvoltage protection level, an undervoltage protection level, and/or an input current limit level for a high voltage of 220 $V_{ac}$ or 230 $V_{ac}$.

In operation S708, according to the determined result that the input voltage is not a high voltage of 220 $V_{ac}$ or 230 $V_{ac}$ (NO in operation S708), the processor 303 may proceed to operation S704 to set an overvoltage protection level, an undervoltage protection level, and/or an input current limit level of the PFC circuit 104 to a level according to a low voltage of 110 $V_{ac}$ or 127 $V_{ac}$, and then proceed to operation S705.

Figure 8:
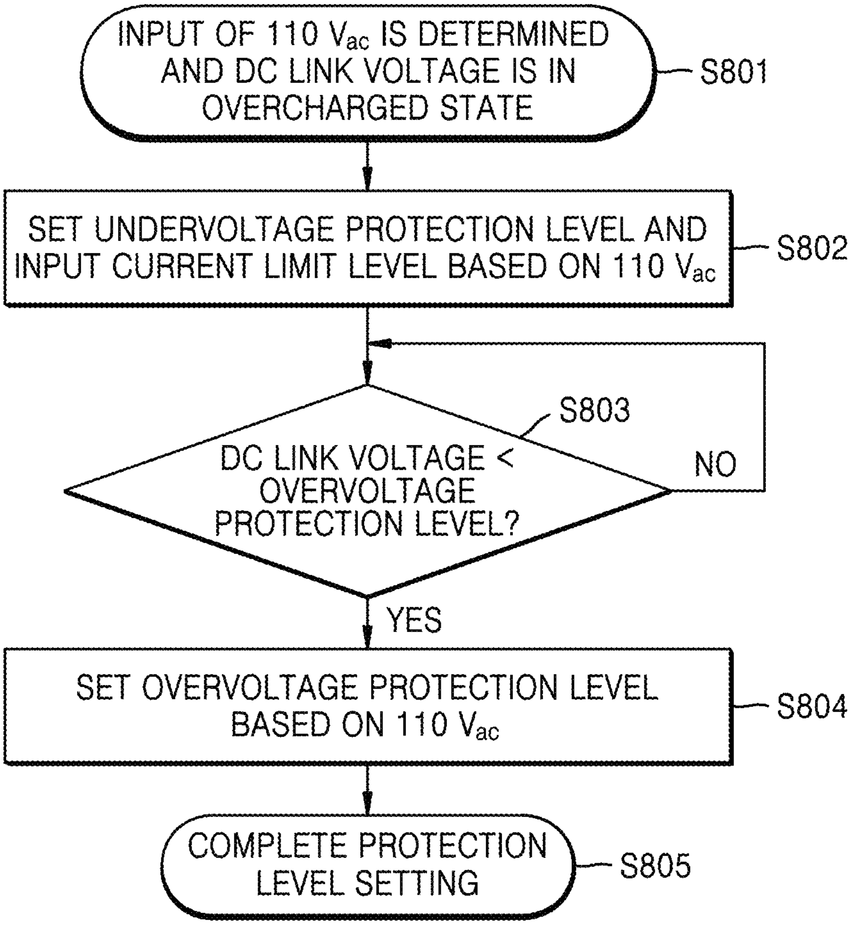
FIG. 8 is a flowchart illustrating operations by a processor, when an input voltage is determined to be a low voltage and a DC link voltage is in an overcharged state, according to an embodiment.

FIG. 8 is a flowchart illustrating operations by the processor 303, when an input voltage is determined to be a low voltage and a DC link voltage is in an overcharged state, according to an embodiment.

In operation S801, according to determination that an input voltage of the PFC circuit 104 is a low voltage of 110 $V_{ac}$ and a DC link voltage is in an overcharged state, the processor 303 may set an undervoltage protection level and an input current limit level of the PFC circuit 104 based on a low voltage of 110 $V_{ac}$, in operation S802.

In operation S803, the processor 303 may compare the DC link voltage of the PFC circuit 104 with a preset overvoltage protection level, and determine that the DC link voltage is lower than an overvoltage level for 110 $V_{ac}$ (YES in operation S803), the processor 303 may set an overvoltage protection level of the PFC circuit 104 based on 110 $V_{ac}$ in operation S804, and treat a protection level setting process as completed in operation S805. For example, the processor 303 may, in operation S803, determine that the DC link voltage is greater than or equal to the overvoltage protection level for 110 $V_{ac}$ (NO in operation S803), and may repeat operation S803 until the processor 303 determines that the DC link voltage is lower than the overvoltage protection level for 110 $V_{ac}$ (YES in operation S803). The processor 303 may repeat operation S803 periodically (e.g., after a predetermined period has elapsed) and/or aperiodically (e.g., on demand, or in response to an interrupt signal or other condition being satisfied).

The embodiment shown in FIG. 8 may be referred to as readjusting an overvoltage protection level of the PFC circuit 104 based on an input voltage of the input power source 101 by comparing obtained DC link voltage information with a preset overvoltage protection level.

Figure 9:
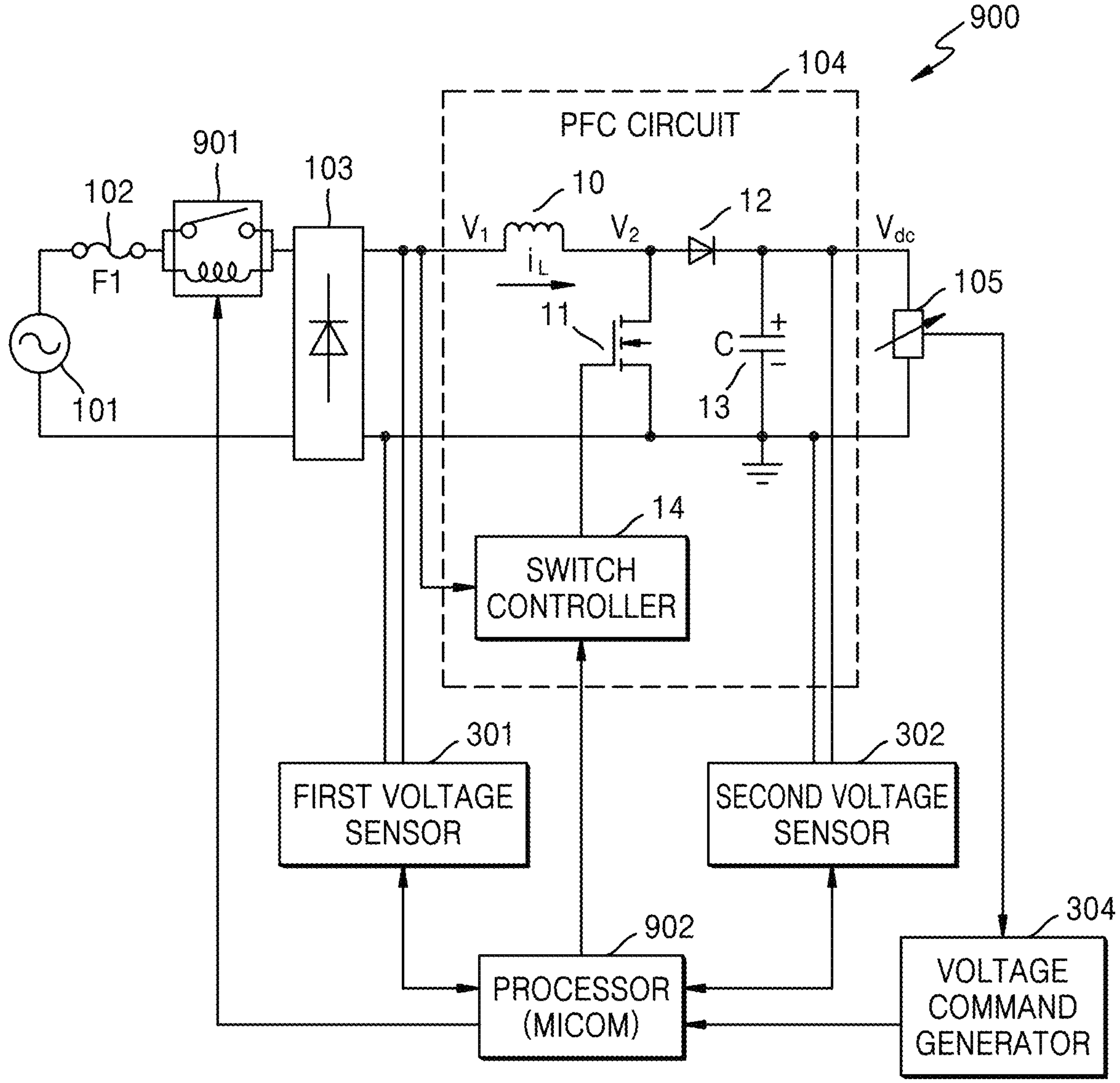
FIG. 9 is a configuration block diagram of an electrical device, according to an embodiment.

FIG. 9 is a configuration block diagram of an electrical device 900 according to an embodiment. The electrical device 900 shown in FIG. 9 is an example in which a component for turning the relay on or off by using a voltage rising slope is further added to the electrical device 300 of FIG. 3. The electrical device 900 may more safely protect elements included in the electrical device 900 against inrush current that may be applied by input current of the input power source 101 in a poor power supply environment, through the added component for turning the relay on or off based on a rising slope of a DC link voltage.

As shown in FIG. 9, the electrical device 900 may include the input power source 101, the fuse 102, the relay 901, the bridge diode 103, the PFC circuit 104, the load 105, the first voltage sensor 301, and the second voltage sensor 302, the voltage command generator 304, and a processor 902, although the present disclosure is not limited thereto. For example, the electrical device 900 may further include the EMI filter 1411.

The input power source 101 may be an AC power source having a low voltage, a high voltage, or a voltage, according to universal standards. For example, the low voltage may include 110 $V_{ac}$±10% or 127 $V_{ac}$, although the present disclosure is not limited thereto. A voltage of 110 $V_{ac}$ described below is an example of a low voltage in an embodiment and may be replaced with a low voltage of another value. The high voltage may include 220 $V_{ac}$±10% or 230 $V_{ac}$, although the present disclosure is not limited thereto. The voltage of 220 $V_{ac}$ described below is an example of a high voltage in an embodiment and may be replaced with a high voltage of another value. The voltage according to the universal standards may range from 85 $V_{ac}$ to 265 $V_{ac}$, although the present disclosure is not limited thereto.

The input power source 101 may be an alternating current power source through a power line connected to a power outlet. The input power source 101 may be a receiver that receives alternating current power wirelessly from a station according to wireless power transmission.

The fuse 102 may be a safety device that protects a circuit downstream by automatically disconnecting when a magnitude of input current provided from the input power source 101 reaches a limit value or more. The bridge diode 103 may be a component that acts as a rectifier to convert an alternating current voltage input through the fuse 102 into a DC voltage. Accordingly, the bridge diode 103 may also be referred to as a rectifier.

Because the PFC circuit 104 generates an output voltage $V_{dc}$ by boosting a direct current voltage $V_1$ transmitted from the bridge diode 103, the PFC circuit 104 may also be referred to as a boost converter. The output voltage $V_{ac}$ may be a voltage across both terminals of the capacitor 13 and may also be referred to as a DC link voltage. The PFC circuit 104 may secure operating performance of the load 105 even when a low voltage is applied from the input power source 101, while potentially preventing damage to the components included in the electrical device 300 in a poor power supply region, by setting maximum DC link voltage information when a voltage of the input power source 101 is 110 $V_{ac}$ to be the same as maximum DC link voltage information when a voltage of the input power source 101 is 220 $V_{ac}$. Securing the operating performance of the load 105 may refer to supplying power required to operate the load 105. For example, securing the operating performance of the load 105 may refer to supplying, in the case in which the load 105 is a compressor motor of an outdoor unit of an air conditioner, power required to drive the compressor motor. The maximum DC link voltage information may also be referred to as a maximum DC link voltage level or a maximum DC link voltage value.

The first voltage sensor 301 may sense an input voltage $V_1$ of the PFC circuit 104. Sensing the input voltage $V_1$ of the PFC circuit 104 may be referred to as sensing input voltage information or an input voltage value of the PFC circuit 104. The first voltage sensor 301 may be configured with a resistor or a capacitor, although the present disclosure is not limited thereto.

The second voltage sensor 302 may sense an output voltage $V_{ac}$ of the PFC circuit 104. Sensing the output voltage $V_{dc}$ of the PFC circuit 104 may be referred to as sensing output voltage information, an output voltage value, DC link voltage information, or a DC link voltage value of the PFC circuit 104. The second voltage sensor 302 may be configured with a resistor or a capacitor, although the present disclosure is not limited thereto.

The processor 902 may read voltage information sensed by the first voltage sensor 301 and the second voltage sensor 302. The processor 902 may receive sensed voltage information from the first voltage sensor 301 and the second voltage sensor 302. The voltage information read from the first voltage sensor 301 may also be referred to as first voltage information. The first voltage information may also be referred to as input voltage information, an input voltage value, or an input voltage. The voltage information read from the second voltage sensor 302 may also be referred to as second voltage information. The second voltage information may also be referred to as an output voltage, output voltage information, an DC link voltage, or DC link voltage information.

The processor 902 may obtain input voltage information based on the first voltage information and the second voltage information. The processor 902 may compare the first voltage information with the second voltage information, and when the first voltage information is the same as the second voltage information, the processor 902 may obtain the same information as input voltage information. When the first voltage information is different from the second voltage information by comparing the first voltage information with the second voltage information, the processor 902 may obtain the first voltage information as input voltage information.

For example, when the first voltage information is 110 $V_{ac}$ (or 127 $V_{ac}$) and the second voltage information is 110 $V_{ac}$ (or 127 $V_{ac}$), the processor 902 may obtain 110 $V_{ac}$ (or 127 $V_{ac}$) as input voltage information. For example, when the first voltage information is 110 $V_{ac}$ (or 127 $V_{ac}$) and the second voltage information is 130 $V_{ac}$ (or 147 $V_{ac}$), the processor 902 may obtain 110 $V_{ac}$ (or 127 $V_{ac}$) as input voltage information. The second voltage information may be 130 $V_{ac}$ (or 147 $V_{ac}$) as a result of boosting by the PFC circuit 104. When the first voltage information is 220 $V_{ac}$ (or 230 $V_{ac}$) and the second voltage information is 220 $V_{ac}$ (or 230 $V_{ac}$), the processor 902 may obtain 220 $V_{ac}$ (or 230 $V_{ac}$) as input voltage information. For example, when the first voltage information is 220 $V_{ac}$ (or 230 $V_{ac}$) and the second voltage information is 235 $V_{ac}$ (or 245 $V_{ac}$), the processor 902 may obtain 220 $V_{ac}$ (or 230 $V_{ac}$) as input voltage information. The second voltage information may be 235 $V_{ac}$ (or 245 $V_{ac}$) as a result of boosting by the PFC circuit 104.

Subsequent to the processor 902 obtaining the input voltage information, the processor 902 may compare the obtained input voltage information with preset reference voltage information to determine whether the input voltage is a low voltage or a high voltage. The preset reference voltage information may be referred to as reference information for determining whether an input voltage is a low voltage or a high voltage based on a variation range of the input voltage. The preset reference voltage information may be stored in the processor 902 or the memory 1470 of FIG. 14. The memory 1470 may be included in the electrical device 900. In the case in which the reference voltage information is stored in the memory 1470, the processor 902 may read the reference voltage information from the memory 1470 and use the reference voltage information. For example, the preset reference voltage information may be set to 165 $V_{ac}$, although the present disclosure is not limited thereto.

When the obtained input voltage information is 165 $V_{ac}$ or less, the processor 902 may determine the input voltage applied from the input power source 101 to be a low voltage. When the obtained input voltage information is greater than 165 $V_{ac}$, the processor 902 may determine the input voltage applied from the input power source 101 to be a high voltage. After the processor 902 determines whether the input voltage is a low voltage or a high voltage, the processor 902 may re-determine whether the input voltage is a low voltage or a high voltage.

To potentially prevent a situation of continuing to monitor input voltage information when the input voltage information is re-determined, the processor 902 may apply hysteresis. For example, the processor 902 may potentially prevent re-determination due to voltage fluctuations through hysteresis of about 30 $V_{ac}$ based on a previously determined voltage. For example, when input voltage information obtained after an input voltage applied from the input power source 101 is determined to be a low voltage of 110 $V_{ac}$ is 180 $V_{ac}$ or more, the processor 902 may determine an input voltage applied to the input power source 101 to be a high voltage of 220 $V_{ac}$. For example, when input voltage information obtained after the processor 902 determines that an input voltage applied from the input power source 101 is a high voltage of 220 $V_{ac}$ is 150 $V_{ac}$ or less, the processor 902 may determine an input voltage applied from the input power source 101 to be a low voltage of 110 $V_{ac}$.

Subsequent to the processor 902 determining that an input voltage applied from the input power source 101 is a low voltage or a high voltage, the processor 902 may set a protection level of the PFC circuit 104 based on the determined input voltage. The protection level may include at least one or all of an overvoltage protection level, an undervoltage protection level, or an input current limit level, although the present disclosure is not limited thereto.

For example, the processor 902 may set an overvoltage protection level and an undervoltage protection level when a determined input voltage is a low voltage to be lower than an overvoltage protection level and an undervoltage protection level when an input voltage is a high voltage. The overvoltage protection level may also be referred to as an overvoltage level, an overvoltage protection value, or an overvoltage value. The undervoltage protection level may also be referred to as an undervoltage level, an undervoltage protection value, or an undervoltage value. For example, the processor 303 may set an input current limit level when an input voltage is a low voltage to be higher than an input current limit level when an input voltage is a high voltage. The input current limit level may also be referred to as an input current limit value or an input current level.

For example, when an input voltage applied from the input power source 101 is a low voltage of 110 $V_{ac}$, the processor 902 may set an undervoltage protection level of the PFC circuit 104 to 65 $V_{ac}$, an overvoltage protection level of the PFC circuit 104 to 210 $V_{ac}$, and an input current limit level of the PFC circuit 104 to 30A, although the present disclosure is not limited thereto. For example, when an input voltage applied from the input power source 101 is a high voltage of 220 $V_{ac}$, the processor 902 may set an undervoltage protection level of the PFC circuit 104 to 140 $V_{ac}$, an overvoltage protection level of the PFC circuit 104 to 270 $V_{ac}$, and an input current limit level of the PFC circuit 104 to 24A, although the present disclosure is not limited thereto. As such, by setting, by the processor 902, an overvoltage protection level, an undervoltage protection level, and/or an input current limit level depending on an input voltage applied from the input power source 101, as described above, damage to the PFC circuit 104 and the components included in the electrical device 900 may potentially be prevented.

To secure the performance of the load 105, the processor 902 may control a boosting operation of the PFC circuit 104 such that a DC link maximum boost level of the PFC circuit 104 when an input voltage applied from the input power source 101 is a low voltage of 110 $V_{ac}$ is equal to a DC link maximum boost level when an input voltage applied from the input power source 101 is 220 $V_{ac}$. Securing the performance of the load 105 may refer to supplying power required by the load 105.

Because the processor 902 controls a DC link maximum boost level of the PFC circuit 104 when an input voltage applied from the input power source 101 is a low voltage to be equal to a DC link maximum boost level of the PFC circuit 104 when an input voltage applied from the input power source 101 is a high voltage, a DC link voltage of the PFC circuit 104 may exceed a reference overvoltage protection level for a low voltage of 110 $V_{ac}$, which may result in generation of an overvoltage error. To potentially prevent the generation of the overvoltage error, the processor 902 may control an operation of the switch controller 14 of the PFC circuit 104 such that, when a DC link voltage of the PFC circuit 104 is boosted according to a voltage command provided from the voltage command generator 304, an overvoltage protection level of 110 $V_{ac}$ increases together, as shown in FIG. 4. A maximum increase value of the overvoltage protection level may be limited to a reference overvoltage protection level for a high voltage of 220 $V_{ac}$ set based on specifications of the capacitor 13 or the switch 11, as shown in FIG. 4.

In an embodiment, the processor 902 may calculate a rising slope of a DC link voltage of the PFC circuit 104, and when the calculated rising slope of the DC link voltage is greater than a preset value (or level), the processor 902 may control an operation of the relay 901 to turn the relay 901 off, thereby limiting a level of inrush current that is applied to the bridge diode 103.

Figure 10:
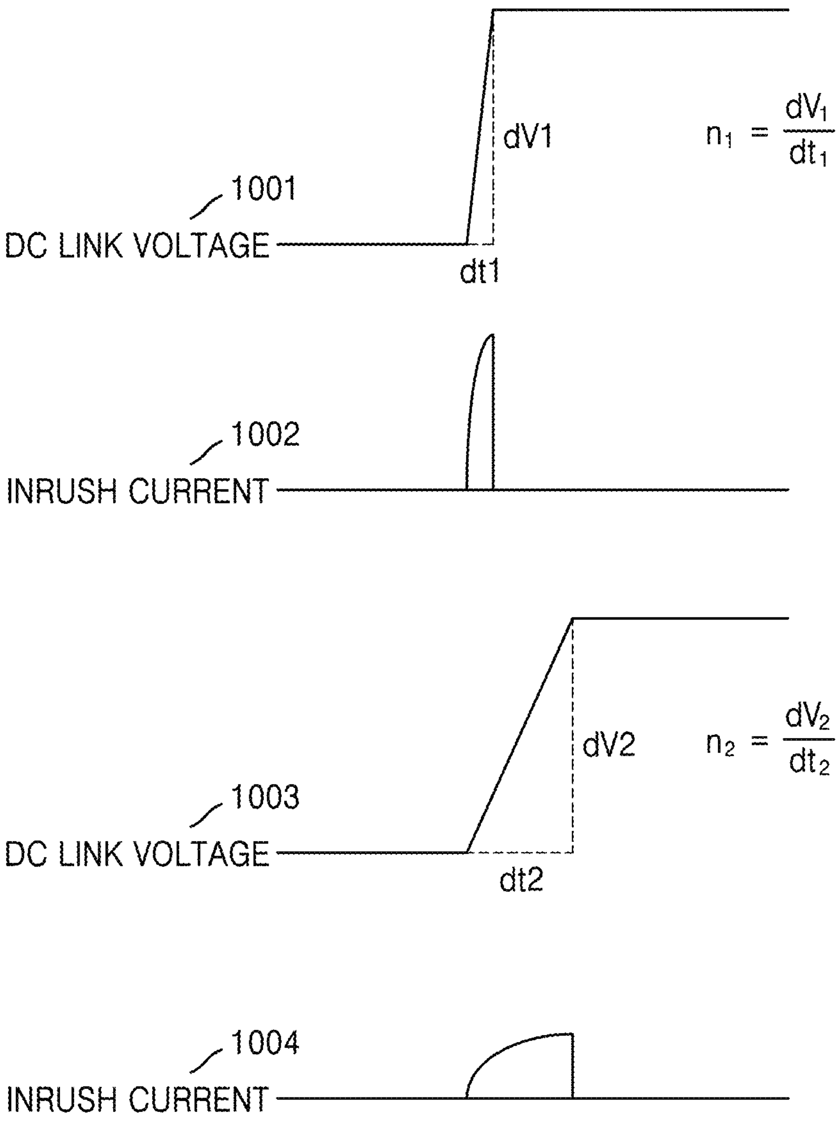
FIG. 10 is an example diagram showing a relationship between an inrush current and rising slopes of a DC link voltage of a PFC circuit, according to an embodiment.

FIG. 10 is an example diagram showing a relationship between an inrush current and rising slopes of a DC link voltage of the PFC circuit 104, according to an embodiment. When a rising slope of a DC link voltage has a sharply increasing slope (e.g., $n_1=dV_1/dt_1$) as shown in 1001 of FIG. 10 while the capacitor 13 of the PFC circuit 104 is not charged, inrush current may be applied as a great value as shown in 1002 of FIG. 10. When a rising slope of a DC link voltage of the PFC circuit 104 is a slope (e.g., $n_2=dV_2/dt_2$) that does not steeply increase as shown in 1003 of FIG. 10, inrush current may not increase significantly as shown in 1004 of FIG. 10 and have a value below specific current.

The processor 902 may control an off operation of the relay 901 to limit an inrush current level as shown in 1004 of FIG. 10.

Figure 11:
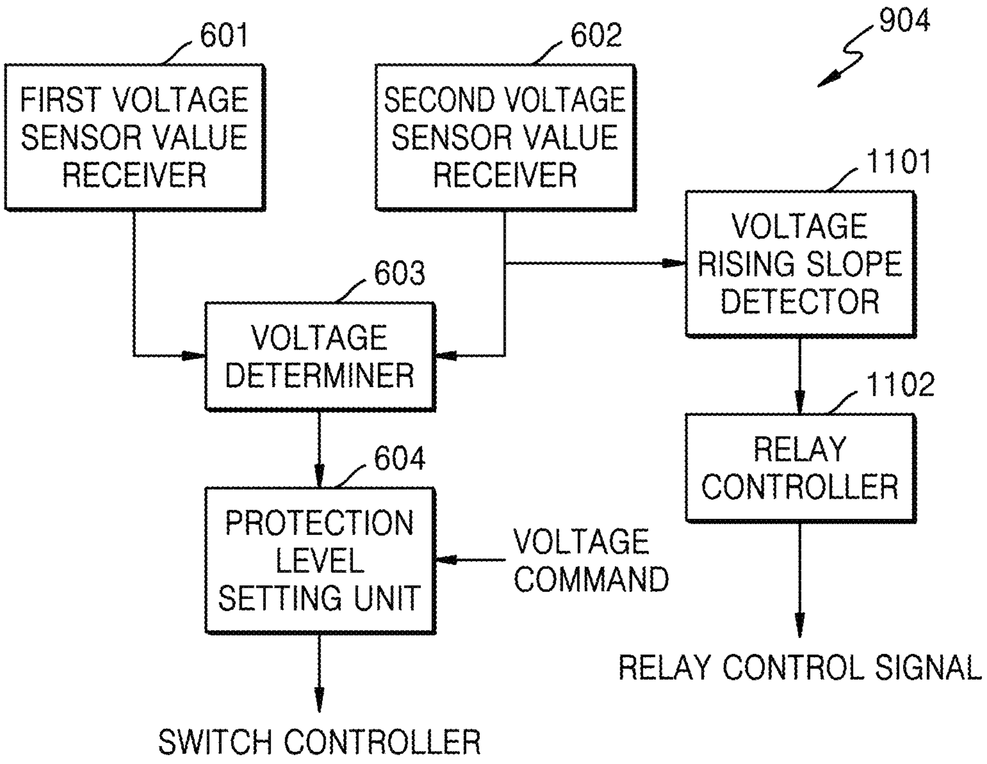
FIG. 11 is a configuration block diagram of a processor shown in FIG. 9, according to an embodiment.

FIG. 11 is a configuration block diagram of the processor 902 shown in FIG. 9. Referring to FIG. 11, the processor 902 may include the first voltage sensor value receiver 601, the second voltage sensor value receiver 602, the voltage determiner 603, and the protection level setting unit 604 described above with reference to FIG. 6, and may further include a voltage rising slope detector 1101, and a relay controller 1102, although the present disclosure is not limited thereto.

The first voltage sensor value receiver 601 may be configured to read an input voltage sensed by the first voltage sensor 301. The first voltage sensor value receiver 601 may be configured to receive an input voltage sensed by the first voltage sensor 301. A configuration of the first voltage sensor value receiver 601 may be determined according to a configuration of the first voltage sensor 301. For example, the first voltage sensor value receiver 601 may determine a connection point to the first voltage sensor 301 depending on whether the first voltage sensor 301 is configured with a resistor or a capacitor.

The second voltage sensor value receiver 602 may be configured to read an input voltage sensed by the second voltage sensor 302. The second voltage sensor value receiver 602 may be configured to receive an input voltage sensed by the second voltage sensor 302. A configuration of the second voltage sensor value receiver 602 may be determined according to a configuration of the second voltage sensor 302. For example, the second voltage sensor value receiver 602 may determine a connection point to the second voltage sensor 302 depending on whether the second voltage sensor 302 is configured with a resistor or a capacitor.

The voltage determiner 603 may obtain an input voltage of the electrical device 300 based on input voltage information of the PFC circuit 104 received by the first voltage sensor value receiver 601 and DC link voltage information of the PFC circuit 104 received by the second voltage sensor value receiver 602. After the input voltage of the electrical device 300 is obtained, the voltage determiner 603 may compare the obtained input voltage with preset reference voltage information to determine whether the input voltage of the electrical device 300 is a low voltage or a high voltage. The preset reference voltage has been described with reference to FIG. 3. For example, the preset reference voltage may be 165 $V_{ac}$. The voltage determiner 603 may be referred to as a voltage judgement unit or a voltage check unit. A unit may be referred to as a processor and/or a portion of a processor (e.g., a core).

The protection level setting unit 604 may set a protection level of the PFC circuit 104 according to a voltage determined by the voltage determiner 603. The protection level of the PFC circuit 104 may include at least one or all of an overvoltage protection level, an undervoltage protection level, or an input current limit level, although the present disclosure is not limited thereto. The protection level of the PFC circuit 104 may be configured to potentially prevent damage to the components included in the electrical device 300 against inrush current that may be generated in a poor power supply environment.

The overvoltage protection level may be set based on a maximum voltage that the components included in the electrical device 300 may withstand. For example, when the input power source 101 is a low voltage, the overvoltage protection level may change based on a DC link boost command voltage according to an operation of the load 105. Accordingly, although the switch controller 14 of FIG. 1 is configured to control an operation of the switch 11 based on an input voltage of the PFC circuit 104, the switch controller 14 may be configured to receive a DC link boost command voltage through another side. The DC link boost command voltage may be based on a motor required voltage according to operating speed of a motor included in the load 105. The undervoltage protection level may be set to potentially prevent damage to the components included in the electrical device 300 against inrush current. The input current limit level may be set to maintain a maximum of an output voltage $V_{ac}$ of the PFC circuit 104.

The overvoltage protection level, the undervoltage protection level, and/or the input current limit level may be set differently depending on whether power applied to the input power voltage 101 is a low voltage or a high voltage. The overvoltage protection level, the undervoltage protection level, and/or the input current limit level may be set in consideration of a voltage variation range per hour in a poor power supply region where rapid variations in voltage may occur while the electrical device 300 operates.

The protection level setting unit 604 may set a protection level of the PFC circuit 104 based on a voltage command generated according to a motor required voltage transmitted from the load 105, as described with reference to FIG. 3. The voltage command may be referred to as a DC link voltage command.

Because the protection level setting unit 604 actively changes a protection level of the PFC circuit 104 according to an input voltage applied from the input power source 101, the protection level setting unit 604 may also be referred to as a protection level changing unit.

The voltage rising slope detector 1101 may obtain a rising slope value of a DC link voltage by detecting a change per hour of a DC link voltage received from the second voltage sensor value receiver 602. The obtained rising slope value of the DC link voltage may be transmitted to the relay controller 1102. The relay controller 1102 may compare the received rising slope value of the DC link voltage with a preset reference level, and when the received rising slope value of the DC link voltage is determined to be greater than the reference level, the relay controller 1102 may output a control signal for turning the relay 901 off to the relay 901.

Figure 12:
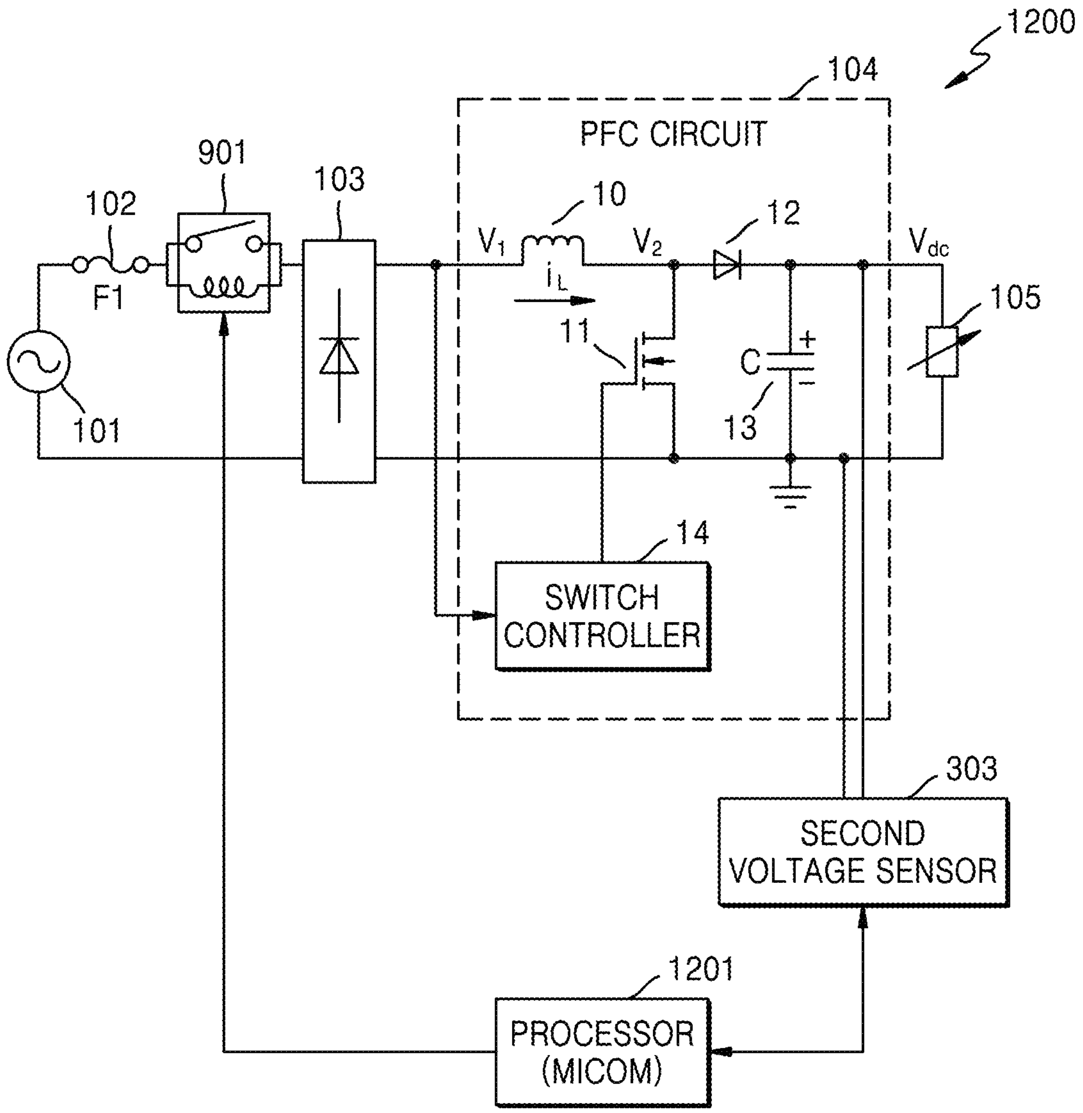
FIG. 12 is a configuration block diagram of an electrical device, according to an embodiment.

FIG. 12 is a configuration block diagram of the electrical device 1200 according to an embodiment. FIG. 12 is an example of an electrical device 1200 capable of potentially preventing damage to elements against inrush current based on a slope of a DC link voltage added in FIG. 9.

The electrical device 120 shown in FIG. 12 may include the input power source 101, the fuse 102, the relay 901, the bridge diode 103, the PFC circuit 104, the load 105, the second voltage sensor 302, and the processor 1201, although the present disclosure is not limited thereto. For example, the electrical device 1200 shown in FIG. 12 may be configured to further include the EMI filter 1411.

The input power source 101 may be an alternating current (AC) power source having a low voltage, a high voltage, or a voltage according to universal standards. For example, the low voltage may include 110 $V_{ac}$±10% or 127 $V_{ac}$, although the present disclosure is not limited thereto. The voltage 110 $V_{ac}$ described below is an example of a low voltage in an embodiment of the present disclosure and may be replaced with a low voltage of another value. The high voltage may include 220 $V_{ac}$±10% or 230 $V_{ac}$, although the present disclosure is not limited thereto. The voltage 220 $V_{ac}$ described below is an example of a high voltage in an embodiment of the present disclosure and may be replaced with a high voltage of another value. The voltage according to the universal standards may range from 85 $V_{ac}$ to 265 $V_{ac}$, although the present disclosure is not limited thereto.

The input power source 101 may be an alternating current power source through a power line connected to a power outlet. The input power source 101 may be a receiver that receives alternating current power wirelessly from a station according to wireless power transmission.

The fuse 102 may be a safety device that protects a circuit downstream by automatically disconnected when a magnitude of input current provided from the input power source 101 reaches a limit value or more. The bridge diode 103 may be a component that acts as a rectifier to convert an alternating current voltage input through the fuse 102 into a direct current voltage. Accordingly, the bridge diode 103 may also be referred to as a rectifier.

Because the PFC circuit 104, as shown in FIG. 12, generates an output voltage $V_{ac}$ by boosting a DC voltage $V_1$ transmitted from the bridge diode 103, the PFC circuit 104 may also be referred to as a boost converter. The output voltage $V_{dc}$ may be a voltage across both terminals of the capacitor 13, and may also referred to as a DC link voltage. The PFC circuit 104 may secure operating performance of the load 105 even when a low voltage is applied from the input power source 101, while potentially preventing damage to the components included in the electrical device 300, in a poor power supply region, by setting a maximum DC link voltage level when a voltage of the input power source 101 is 110 $V_{ac}$ to be the same as maximum DC link voltage information when a voltage of the input power source 101 is 220 $V_{ac}$. The maximum DC link voltage information may also be referred to as a maximum DC link voltage level or a maximum DC link voltage value.

The second voltage sensor 302 may sense an output voltage $V_{ac}$ of the PFC circuit 104. Sensing the output voltage $V_{dc}$ of the PFC circuit 104 may be referred to as sensing output voltage information, an output voltage value, DC link voltage information, or a DC link voltage value of the PFC circuit 104. The second voltage sensor 302 may be configured with a resistor or a capacitor, although the present disclosure is not limited thereto.

The processor 1201 may read voltage information sensed by the second voltage sensor 302. The processor 1201 may receive sensed voltage information from the second voltage sensor 302. The voltage information read from the second voltage sensor 302 may also be referred to as second voltage information. The second voltage information may also be referred to as an output voltage, output voltage information, an DC link voltage, or DC link voltage information.

The processor 1201 may calculate a rising slope of a DC link voltage of the PFC circuit 104, read from the second voltage sensor 302, and when the calculated rising slope of the DC link voltage is greater than a preset value (or level), the processor 1201 may control an operation of the relay 901 to turn the relay 901 off, thereby potentially limiting a level of inrush current that is applied to the bridge diode 103. Limiting the level of inrush current has been described above with reference to the voltage rising slope detector 1101 and the relay controller 1102 of FIG. 11.

The electrical device 1200, as shown in FIG. 12, may include the relay 901, the PFC circuit 104 connected to the relay 901 to correct a power factor of the electrical device 1200, the second voltage sensor 302 that detects DC link voltage information of the PFC circuit 104, and the at least one processor 1201. The at least one processor 1201 may calculate a rising slope of a DC link voltage of the PFC circuit 104 based on DC link voltage information detected by the second voltage sensor. The at least one processor 1201 may be configured to control, when the calculated rising slope of the DC link voltage is greater than a preset value (or level), an operation of the relay 901 to turn the relay 901 off.

Figure 13:
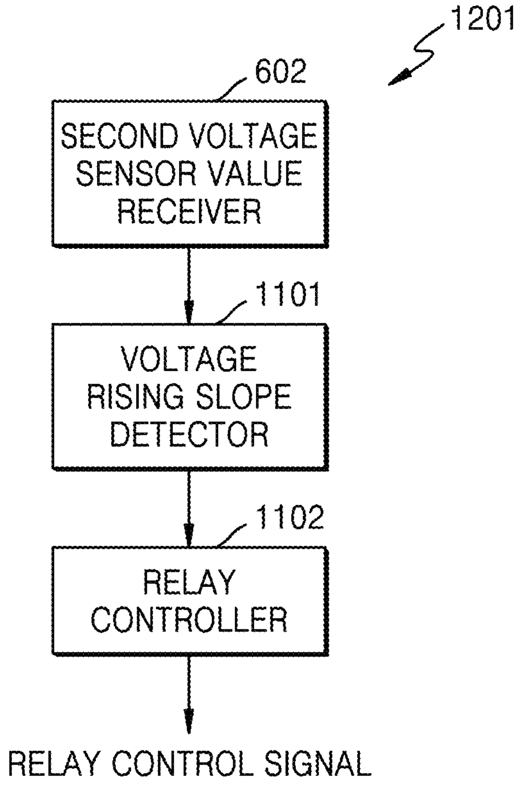
FIG. 13 is a configuration block diagram of a processor shown in FIG. 12, according to an embodiment.

FIG. 13 is a configuration block diagram of the processor 1201 shown in FIG. 12. Referring to FIG. 13, the processor 1201 may include the second voltage sensor value receiver 602, the voltage rising slope detector 1101, and the relay controller 1102.

The second voltage sensor value receiver 602 may be configured to read an input voltage sensed by the second voltage sensor 302. The second voltage sensor value receiver 602 may be configured to receive an input voltage sensed by the second voltage sensor 302. A configuration of the second voltage sensor value receiver 602 may be determined according to a configuration of the second voltage sensor 302. For example, the second voltage sensor value receiver 602 may determine a connection point to the second voltage sensor 302 depending on whether the second voltage sensor 302 is configured with a resistor or a capacitor.

The voltage rising slope detector 1101 may obtain a rising slope value of a DC link voltage by detecting a change per hour of a DC link voltage received from the second voltage sensor value receiver 602. The obtained rising slope value of the DC link voltage may be transmitted to the relay controller 1102. The relay controller 1102 may compare the received rising slope value of the DC link voltage with a preset reference level, and when the received rising slope value of the DC link voltage is determined to be greater than the reference level, the relay controller 1102 may output a control signal for turning the relay 901 off to the relay 901.

Figure 14:
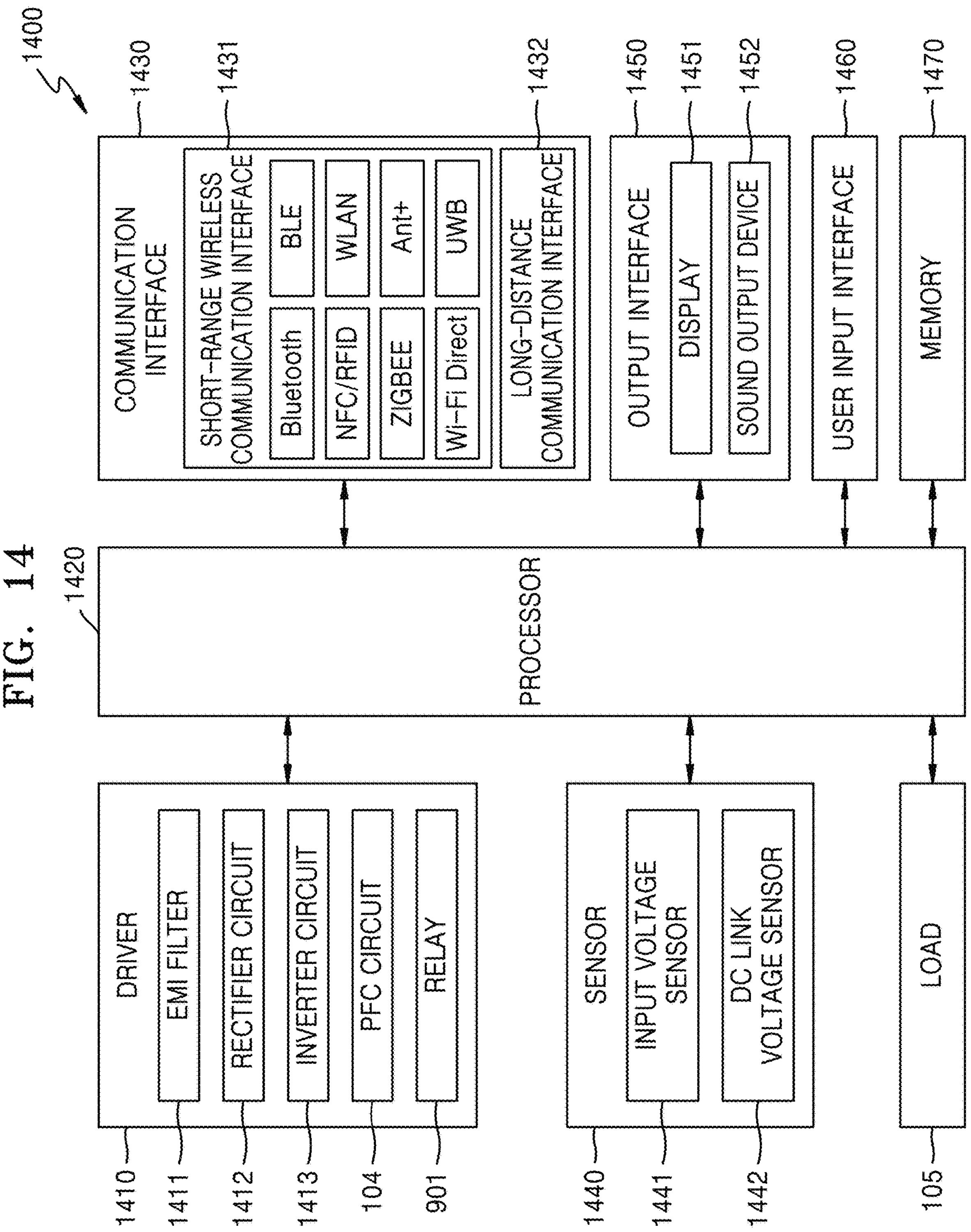
FIG. 14 is a configuration block diagram of an electrical device, according to an embodiment.

FIG. 14 is a configuration block diagram of an electrical device 1400 according to an embodiment of the present disclosure.

Referring to FIG. 14, the electrical device 1400 may be configured to actively set a protection level of the PFC circuit 104 according to an input voltage and secure performance of the load 105, similar to the electrical devices 300, 900, and 1200 described with reference to FIGS. 3, 9, and 12. Securing the performance of the load 105 may refer to supplying power required by the load 105.

As shown in FIG. 14, the electrical device 1400, according to an embodiment, may include a driver 1410, a processor 1420, a communication interface 1430, a sensor 1440, an output interface 1450, a user input interface 1460, a memory 1470, and the load 105. The components of the electrical device 1400 may not be essential. Another component may be added or some components may be omitted according to a design concept of a manufacturing company.

The driver 1410 may receive power from the input power source 101 or an external source (ES), and supply current to the load 105 according to a driving control signal from the processor 1420. The driver 1410 may include the EMI filter 1411, a rectifier circuit 1412, an inverter circuit 1413, the PFC circuit 104, and the relay 901, although the present disclosure is not limited thereto.

The EMI filter 1411 may block high-frequency noise included in alternating current power supplied from the input power source 101 or the external source ES, and pass an alternating current voltage and alternating current of a preset frequency (e.g., 50 Hz or 60 Hz). The fuse 102 and the relay 901 for blocking an overvoltage may be provided between the EMI filter 1411 and the external source ES. Alternating current power from which high-frequency noise has been removed by the EMI filter 1411 may be supplied to the rectifier circuit 1412.

The rectifier circuit 1412 may convert the alternating current power into direct current power. For example, the rectifier circuit 1412 may convert an alternating current voltage of which a magnitude and polarity (e.g., a positive voltage or a negative voltage) change according to a time, into a direct current voltage having a constant magnitude and polarity, and convert alternating current of which a magnitude and direction (e.g., positive current or negative current) change according to a time, into direct current having a constant magnitude. The rectifier circuit 1412 may include the bridge diode 103. For example, the rectifier circuit 1412 may include four (4) diodes. The bridge diode 103 may convert an alternating current voltage of which a polarity changes according to a time, into a positive voltage having a constant polarity, and convert alternating current of which a direction changes according to a time, into positive current having a constant direction.

The inverter circuit 1413 may include a switching circuit that supplies current to the load 105 or potentially prevents current from being supplied to the load 105. The switching circuit may include a first switch and a second switch. The first switch and the second switch may be connected in series between a plus (positive) line and a minus (negative) line output from the rectifier circuit 1412. The first switch and the second switch may be turned on and/or off according to a driving control signal from the processor 1420.

The inverter circuit 1413 may control current that is supplied to the load 105. For example, by turning on/off the first switch and the second switch included in the inverter circuit 1413, a magnitude and direction of current flowing to the load 105 may change. In this case, alternating current may be supplied to the load 105. According to a switching operation of the first switch and the second switch, sinusoidal alternating current may be supplied to the load 105. In addition, as switching cycles of the first switch and the second switch become longer (e.g., as switching frequencies of the first switch and the second switch become smaller), current supplied to the load 105 may become larger or intensity of a magnetic field output to the load 105 may become greater. The inverter circuit 1413 of FIG. 14 may be required when alternating current is supplied to the load 105, and therefore, the inverter circuit 1413 may not be required in the electrical device 300, 900, or 1200 that supplies direct current to the load 105. The inverter circuit 1413 of the electrical device 1400, according to an embodiment, may be replaced with the PFC circuit 104 included in the electrical device 300, 900, or 1200.

An off operation of the relay 901 may be controlled by the processor 1420 based on a detection result of a rising slope of a DC link voltage, as described with reference to FIG. 9.

The processor 1420 may control overall operations of the electrical device 1400. The processor 1420 may execute programs stored in the memory 1470 to control the communication interface 1430, the sensor 1440, the output interface 1450, the user input interface 1460, the memory 1470, and the load 105.

According to an embodiment, the electrical device 1400 may include an artificial intelligence (AI) processor therein. The AI processor may be manufactured in the form of a dedicated hardware chip for AI, or may be manufactured as a part of an existing general-purpose processor (e.g., central processing unit (CPU) or application processor) or a graphic dedicated processor (e.g., graphic processing unit (GPU)) and installed in the electrical device 1400.

According to an embodiment, the processor 1420 may set an overvoltage protection level, an undervoltage protection level, and/or an input current limit level according to whether an input voltage of the PFC circuit 104 is a low voltage or a high voltage, control a maximum value of a DC link voltage, and control an off operation of the relay 901 based on a slope of the DC link voltage.

The processor 1420 may store, in the memory 2700, a reference voltage value used for determining whether an input voltage of the PFC circuit 104 is a low voltage or a high voltage and a reference value for determining whether a slope of a DC link voltage is a preset level or more, and read and use the reference voltage value or the reference value stored in the memory 2700.

The processor 1420 may include the communication interface 1430 to operate on an Internet of Things (IoT) network or a home network as necessary.

The communication interface 1430 may include a short-range wireless communication interface 1431 and a long-distance communication interface 1432. The short-range wireless communication interface 1431 may include a Bluetooth™ communication interface, a Bluetooth Low Energy (BLE) communication interface, a Near Field Communication (NFC) interface, a Wireless Local Access Network (WLAN, such as a Wireless-Fidelity (Wi-Fi) network, for example) communication interface, a Zigbee communication interface, an Infrared Data Association (IrDA) communication interface, a Wi-Fi Direct (WFD) communication interface, a Ultra Wideband (UWB) communication interface, and an Ant+ communication interface, although the present disclosure is not limited thereto. The long-distance communication interface 1432 may transmit and/or receive a wireless signal to/from at least one among a base station, an external terminal, or a server on a mobile communication network. As used herein, the wireless signal may include a voice call signal, a video call signal or various formats of data according to transmission/reception of text/multimedia messages. The long-distance communication interface 1432 may include a third Generation (3G) module, a fourth Generation (4G) module, a fifth Generation (5G) module, a Long-Term Evolution (LTE) module, a Narrowband Internet of Thing (NB-IoT) module, a Long Term Evolution for Machines (LTE-M) module, or the like, although the present disclosure is not limited thereto.

According to an embodiment, the electrical device 1400 may communicate with and transmit and/or receive data to/from an external server or another electrical device through the long-distance communication interface 1432.

The sensor 1440 may include an input voltage sensor 1441 and a DC link voltage sensor 1442, although the present disclosure is not limited thereto. For example, the sensor 1440 may further include a current sensor. The current sensor may sense input current of the electrical device 1400. The current sensor may be positioned at various locations of a circuit of the electrical device 1400 to obtain current (e.g., alternating current) information. The input voltage sensor 1441 may be used to sense voltage information of the input power source 101 of the electrical device 1400. The input voltage sensor 1441 may correspond to the first voltage sensor 301. The DC link voltage sensor 1442 may be used to sense a DC link voltage of the PFC circuit 104. The DC link voltage sensor 1442 may correspond to the second voltage sensor 302.

The output interface 1450 may be used to output an audio signal or a video signal, and include a display 1451 and a sound output device 1452.

According to an embodiment, the electrical device 1400 may display information related to the electrical device 1400 through the display 1451. For example, the electrical device 1400 may display, on the display 1451, power factor information of the electrical device 1400, a current input voltage, and information about whether a protection level of the PFC circuit 104 has been set.

In the case in which the display 1451 and a touch pad form a layer structure to be configured as a touch screen, the display 1451 may be used as an input device, as well as an output device. The display 1451 may include at least one of a liquid crystal display (LCD), a thin film transistor-liquid crystal display (TFT-LCD), a light-emitting diode (LED) display, an organic light-emitting diode (OLED) display, a flexible display, a 3-dimensional (3D) display, or an electrophoretic display. According to an implementation type of the electrical device 1400, the electrical device 1400 may include two (2) or more displays 1451.

The sound output device 1452 may output audio data that is received from the communication interface 1430 or stored in the memory 1470. The sound output device 1452 may output a sound signal related to a function that is performed by the electrical device 1400. The sound output device 1452 may include a speaker, a buzzer, or the like.

According to an embodiment, the output interface 1450 may output at least one from among power factor information, input voltage information, information about whether a protection level for the PFC circuit 104 has been set, or information indicating that a protection level is changing, through the display 1451.

The user input interface 1460 may be used to receive an input from a user. The user input interface 1460 may include at least one from among a key pad, a dome switch, a touch pad (a capacitive type, a resistive type, an infrared beam type, a surface acoustic wave conduction type, an integral strain gauge type, a piezoelectric effect type, or the like), a jog wheel, or a jog switch, although the present disclosure is not limited thereto.

The user input interface 1460 may include a voice recognition module. For example, the electrical device 1400 may receive a voice signal as an analog signal through a microphone, and convert a voice part into a computer-readable text through an Automatic Speech Recognition (ASR) model. The electrical device 1400 may obtain a user's utterance intention by interpreting the converted text by using a Natural Language Understanding (NLU) model. In an embodiment, the ASR model and/or the NLU model may be an AI model. The AI model may be processed by an AI-dedicated processor designed with a hardware structure specialized for processing AI models. The AI model may be created through training. As used herein, creating through training may refer to creating a predefined operation rule or artificial intelligent model set to perform a desired characteristic (or a purpose) by training a basic AI model with a plurality of pieces of training data through a training algorithm. The AI model may be configured with a plurality of neural network layers. Each of the plurality of neural network layers may have a plurality of weight values and perform a neural network operation through computation between a computation result of a previous layer and the plurality of weight values.

Linguistic understanding may refer to technology of recognizing and applying/processing human language/characters, and may include natural language processing, machine translation, dialog system, question answering, and speech recognition/synthesis, or the like.

The memory 1470 may store a program for processing and/or controlling by the processor 1420, and may also store input/output data (e.g., power factor information of the electrical device 1400, input voltage information, information related to protection level settings, or the like). The memory 1470 may also store an AI model.

The memory 220 may include at least one type of storage medium from among a flash memory type, a hard disk type, a multimedia card micro type, card type memory (e.g., Secure Digital (SD) memory or extreme Digital (XD) memory), random access memory (RAM), static random access memory (SRAM), read-only memory (ROM), electrically erasable programmable read-only memory (EEPROM), programmable read-only memory (PROM), magnetic memory, a magnetic disk, or an optical disk. The control device 1400 may operate a web storage or cloud server that performs a storage function on the Internet.

Figure 15:
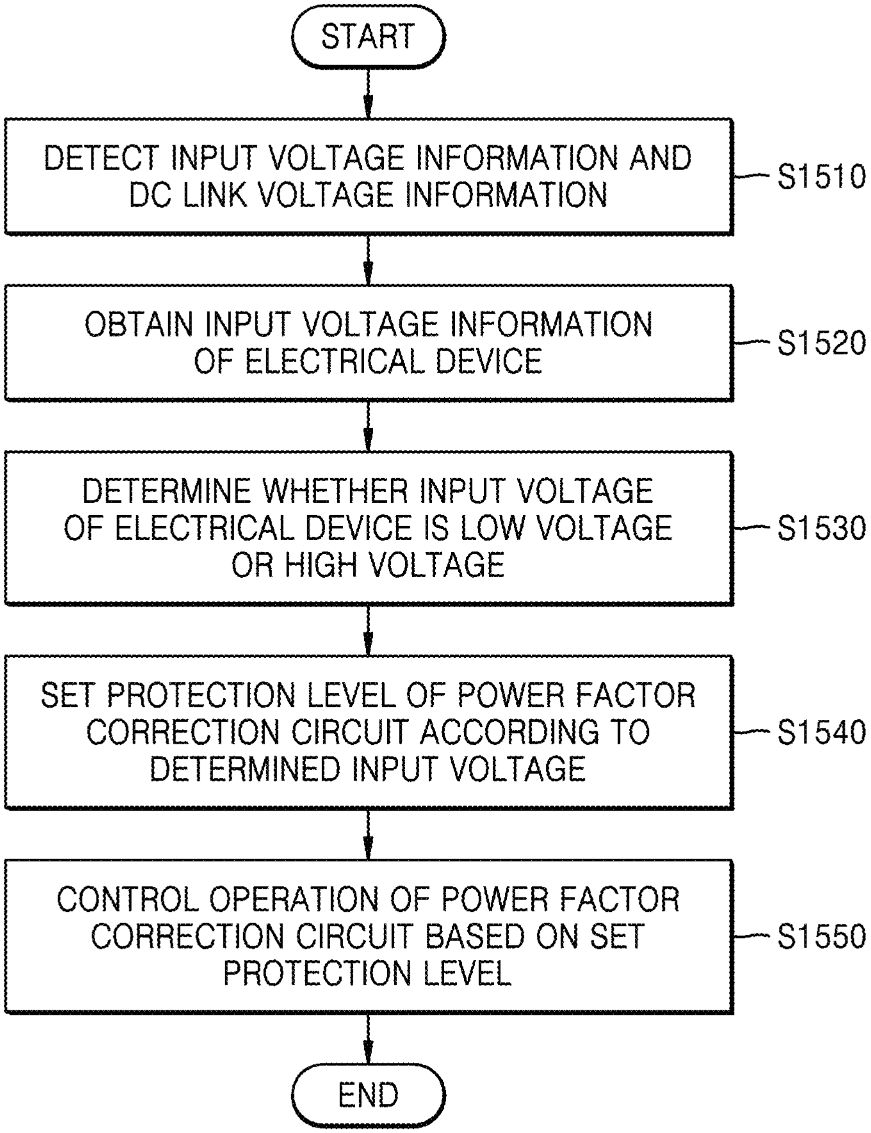
FIG. 15 is a flowchart illustrating operations of an electrical device, according to an embodiment.

FIG. 15 is a flowchart illustrating operations of an electrical device according to an embodiment of the present disclosure. FIG. 15 is an example of controlling an operation of the PFC circuit 104 by determining whether an input voltage applied from the input power source 101 is a low voltage or a high voltage based on an input voltage and a DC link voltage of the PFC circuit 104 and setting a protection level of the PFC circuit 104 according to the determined voltage, and operations of FIG. 15 may be performed by the electrical device 300 of FIG. 3, the electrical device 900 of FIG. 9, and the electrical device 1400 of FIG. 14. Hereinafter, for convenience of description, the operations of FIG. 15 are described as being performed by the electrical device 300 of FIG. 3, but it should be interpreted that the electrical device 1400 shown in FIGS. 9 and 14 may also perform the operations of FIG. 15.

In operation S1510, the processor 303 of the electrical device 300 may detect input voltage information of the PFC circuit 104 from the first voltage sensor 301 and detect DC link voltage information of the PFC circuit 104 from the second voltage sensor 302. Detecting the input voltage information from the first voltage sensor 301 may also be referred to as reading or receiving an input voltage from the first voltage sensor 301 by the processor 303. Detecting the DC link voltage information from the second voltage sensor 302 may also be referred to as reading and/or receiving a DC link voltage from the second voltage sensor 302 by the processor 303.

In operation S1520, the processor 303 may obtain an input voltage of the electrical device 300. The processor 303 may obtain the input voltage based on the detected input voltage information and the DC link voltage information. According to the detected input voltage information being different from the DC link voltage information, the detected input voltage information may be obtained as input voltage information. When the detected input voltage information is the same as the DC link voltage information, the same voltage information may be obtained as input voltage information.

In operation S1530, the processor 303 may determine whether the input voltage of the electrical device 300 is a low voltage or a high voltage. The processor 303 may determine a low voltage or a high voltage based on a preset reference voltage (e.g., 165 $V_{ac}$). For example, when the detected input voltage information is lower than or equal to the preset reference voltage, the processor 303 may determine a low voltage, and, when the detected input voltage information is higher than the preset reference voltage, the processor 303 may determine a high voltage. Also, the processor 303 may re-determine whether the input voltage is a low voltage or a high voltage by applying hysteresis, as described with reference to FIG. 3.

In operation S1540, the processor 303 may set a protection level of the PFC circuit 104 according to the determined input voltage. The protection level may include an overvoltage protection level, an undervoltage protection level, and/or an input current limit level, although the present disclosure is not limited thereto. An overvoltage protection level, an undervoltage protection level, and/or an input current limit level may be set actively according to an input voltage, as described with reference to FIG. 3. In an embodiment, the processor 330 may control an operation of the PFC circuit 104 such that a DC link maximum boost level of the PFC circuit 104 when the determined input voltage is a low voltage is equal to a DC link maximum boost level when the input voltage is a high voltage. When the determined voltage is a low voltage, the processor 330 may perform a control of increasing an overvoltage protection level together with the DC link voltage of the PFC circuit 104 in response to a voltage command based on an operation of the load 105 included in the electrical device 900. In operation S1540, the processor 303 may set an overvoltage protection level and an undervoltage protection level of the PFC circuit 104 according to the determined input voltage, as described with reference to FIG. 3. In operation S1540, the processor 303 may set an input current limit level of the PFC circuit 104 according to the determined input voltage, as described with reference to FIG. 3. In operation S1540, the processor 303 may set an overvoltage protection level and an input current limit level of the PFC circuit 104 according to the determined input voltage, as described with reference to FIG. 3. In operation S1540, the processor 303 may set an undervoltage protection level and an input current limit level of the PFC circuit 104 according to the determined input voltage, as described with reference to FIG. 3.

In operation S1550, the processor 303 may control an operation of the PFC circuit 104, such as controlling a turn-on and/or turn-off cycle of the switch 11 of the PFC circuit 104, based on the set protection level. Controlling the turn-on and/or turn-off cycle of the switch 11 may include changing a cycle of the switch 11. For example, when the determined input voltage is a low voltage, the processor 303 may control an operation of the PFC circuit 104 to start boosting the DC link voltage at a lower voltage than when the input voltage is a high voltage.

Figure 16:
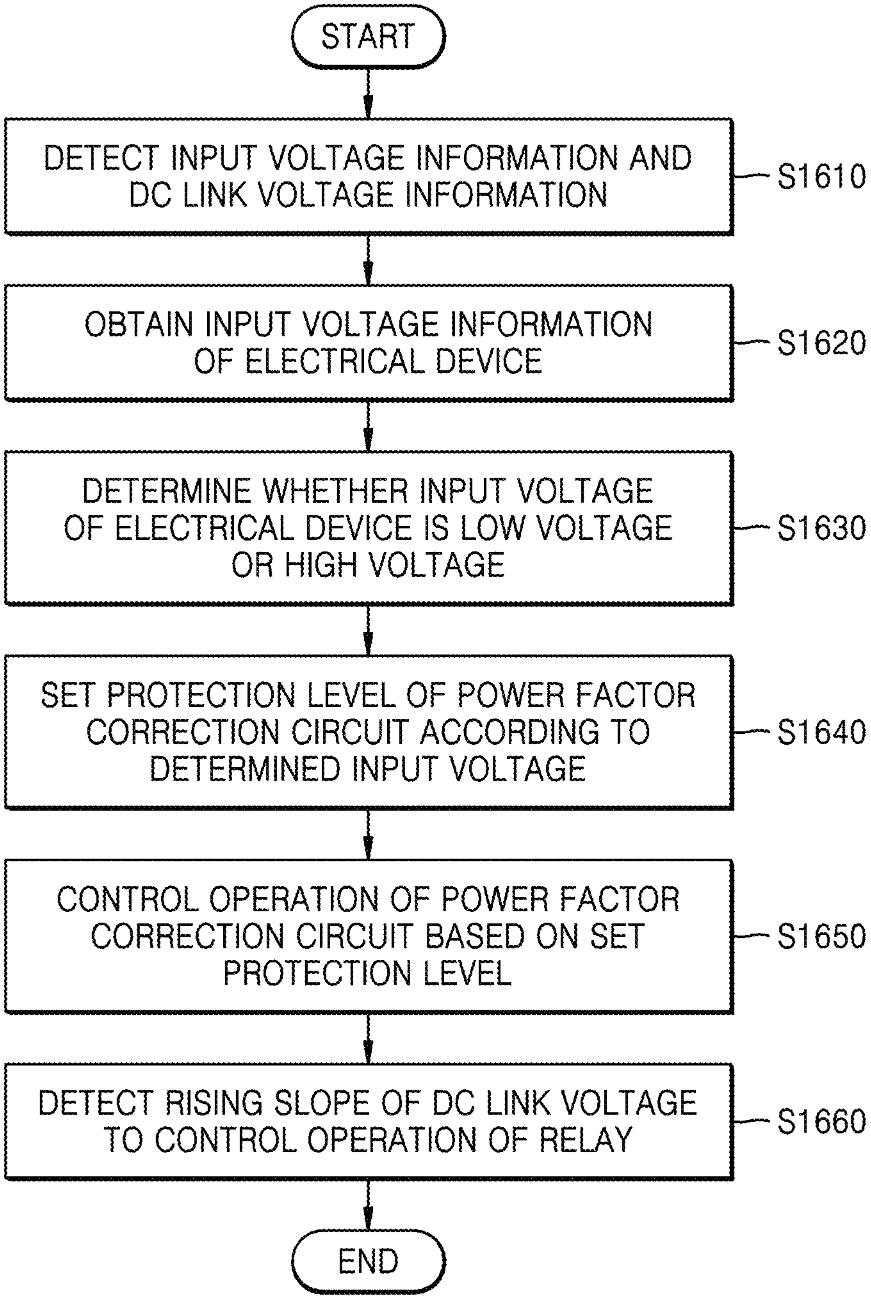
FIG. 16 is a flowchart illustrating operations of an electrical device, according to an embodiment.

FIG. 16 is a flowchart illustrating operations of an electrical device according to an embodiment of the present disclosure. FIG. 16 is an example in which an operation of controlling a relay off operation based on a slope of a DC link voltage described with reference FIG. 9 is added to the operation flowchart of FIG. 15. Therefore, the following description is based on the electrical device 900 shown in FIG. 9. However, the following operations may also be performed by the electrical device 1400 of FIG. 14.

In operation S1610, the processor 902 of the electric device 900 may detect input voltage information of the PFC circuit 104 from the first voltage sensor 301 and detect DC link voltage information of the PFC circuit 104 from the second voltage sensor 302. Detecting input voltage information from the first voltage sensor 301 may also be referred to as reading or receiving an input voltage from the first voltage sensor 301 by the processor 303. Detecting DC link voltage information from the second voltage sensor 302 may also be referred to as reading or receiving a DC link voltage from the second voltage sensor 302 by the processor 902.

In operation S1620, the processor 902 may obtain an input voltage of the electrical device 900. The processor 902 may obtain the input voltage based on the detected input voltage information and the DC link voltage information. According to the detected input voltage information being different from the DC link voltage information, the processor 902 may obtain the detected input voltage information as input voltage information. According to the detected input voltage information being the same as the DC link voltage information, the processor 902 may obtain the same voltage information as input voltage information.

In operation S1630, the processor 902 may determine whether the input voltage of the electrical device 900 is a low voltage or a high voltage. The processor 902 may determine a low voltage or a high voltage by using a preset reference voltage (e.g., 165 $V_{ac}$). For example, according to the detected input voltage information being lower than or equal to the preset reference voltage, the processor 902 may determine a low voltage, and, according to the detected input voltage information being higher than the preset reference voltage, the processor 902 may determine a high voltage. In an embodiment, the processor 902 may re-determine whether the input voltage is a low voltage or a high voltage by applying hysteresis, as described with reference to FIG. 3.

In operation S1640, the processor 902 may set a protection level of the PFC circuit 104 according to the determined input voltage. The protection level may include an overvoltage protection level, an undervoltage protection level, and/or an input current limit level, although the present disclosure is not limited thereto. An overvoltage protection level, an undervoltage protection level, and/or an input current limit level may be set actively according to the input voltage, as described with reference to FIG. 3. In an embodiment, the processor 330 may control an operation of the PFC circuit 104 such that a DC link maximum boost level of the PFC circuit 104 when the determined input voltage is a low voltage is equal to a DC link maximum boost level when the input voltage is a high voltage. According to the determined voltage being a low voltage, the processor 902 may perform a control of increasing an overvoltage protection level together with the DC link voltage of the PFC circuit 104 in response to a voltage command based on an operation of the load 105 included in the electrical device 900.

In operation S1640, the processor 902 may set an overvoltage protection level and an undervoltage protection level of the PFC circuit 104 according to the determined input voltage, as described with reference to FIG. 3. In operation S1640, the processor 902 may set an input current limit level of the PFC circuit 104 according to the determined input voltage, as described with reference to FIG. 3. In operation S1640, the processor 902 may set an overvoltage protection level and an input current limit level of the PFC circuit 104 according to the determined input voltage, as described with reference to FIG. 3. In operation S1640, the processor 902 may set an undervoltage protection level and an input current limit level of the PFC circuit 104 according to the determined input voltage, as described with reference to FIG. 3.

In operation S1650, the processor 902 may control an operation of the PFC circuit 104, such as controlling a turn-on or turn-off cycle of the switch 11 of the PFC circuit 104, based on the set protection level. When the determined input voltage is a low voltage, the processor 902 may control an operation of the PFC circuit 104 to start boosting the DC link voltage at a lower voltage than when the input voltage is a high voltage. Controlling the turn-on or turn-off cycle of the switch 11 may refer to controlling an operation cycle of the switch 11. Controlling the operating cycle of the switch 11 may include changing the operating cycle of the switch 11.

In operation S1660, the processor 902 may detect a rising slope of a DC link voltage of the PFC circuit 104, and according to the detected rising slope of the DC link voltage being greater than a preset value, the processor 902 may control an operation of the relay 901 to turn the relay 901 off. The preset value may be read from the memory 1470 or may be a value stored in the processor 902.

Figure 17:
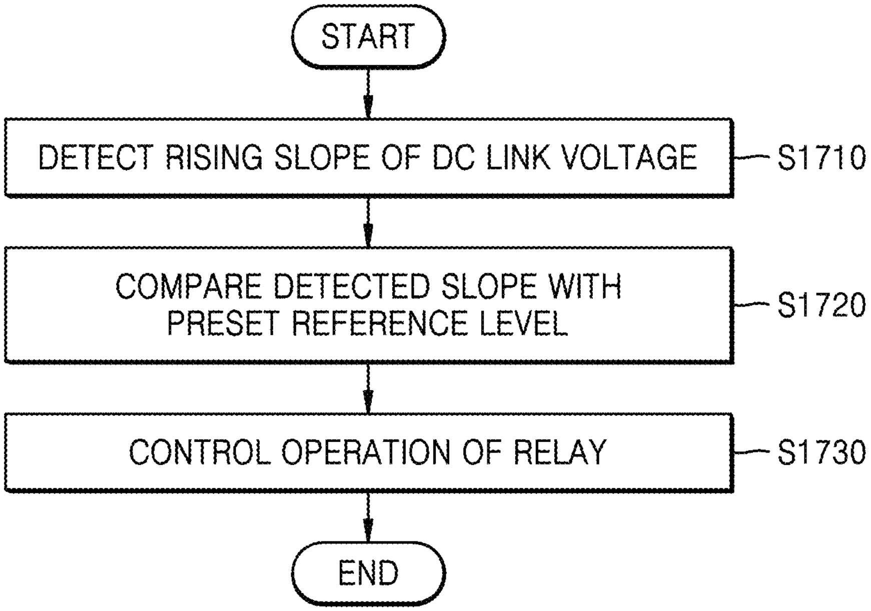
FIG. 17 is a flowchart illustrating operations of an electrical device, according to an embodiment.

FIG. 17 is a flowchart illustrating operations of an electrical device according to an embodiment of the present disclosure. FIG. 17 is an example for potentially preventing damage to components of the electrical device 1200 against inrush current by controlling an operation of a relay based on a slope of a DC link voltage of the PFC circuit 104, shown in FIG. 12.

In operation S1710, the processor 1201 of the electrical device 1200 may detect a rising slope of a DC link voltage of the PFC circuit 104, as shown in FIG. 10. In operation S1720, the processor 1201 of the electrical device 1200 may compare the detected rising slope of the DC link voltage with a preset reference level. In operation S1730, the processor 1201 may control an operation of the relay 901 based on a result compared in operation S1720. For example, according to the rising slope of the DC link voltage detected in operation S1720 being greater than or equal to the preset reference level, the processor 1201 may control the relay to turn the relay off, in operation S1730. According to the rising slope of the DC link voltage detected in operation S1720 being smaller than the preset reference level, the processor 1201 may control the relay to maintain the relay in a turned-on state, in operation S1730.

A method of controlling the electrical device 1200 including the PFC circuit 104 based on the flowchart shown in FIG. 17 may include detecting input voltage information of the PFC circuit 104 by the at least one processor 1201. The method of controlling the electrical device 1200 including the PFC circuit 104 based on the flowchart shown in FIG. 17 may include detecting DC link voltage information of the PFC circuit 104 by the at least one processor 1201. The processor 1201 may detect the DC link voltage information of the PFC circuit 104 from the second voltage sensor 302. The method of controlling the electrical device 1200 including the PFC circuit 104 based on the flowchart shown in FIG. 17 may include calculating, by the at least one processor 1201, a rising slope of a DC link voltage of the PFC circuit 104 based on the detected DC link voltage information. The method of controlling the electrical device 1200 including the PFC circuit 104 based on the flowchart shown in FIG. 17 may include controlling an operation of the relay 901 to turn the relay 901 off when the rising slope of the DC link voltage calculated by the at least one processor 1201 is greater than a preset value (or level).

The above-described electrical devices 100, 300, 900, 1200, and 1400 may also be referred to as an electrical device according to an embodiment of the present disclosure.

As described above, by setting a protection level of the PFC circuit 104 according to an input voltage applied from the input power source 101, and controlling increases of an overvoltage protection level and a DC link voltage of the PFC circuit 104 according to a voltage command based on a motor required voltage by the load 105, it may be possible to supply stable power even in a poor power supply environment where a plurality of voltages are used, without a component such as a transformer that changes an input voltage, and to secure performance of the load.

An electrical device (e.g., electrical device 100, 300, 900, 1200, or 1400), according to an embodiment, may include a PFC circuit 104 configured to correct a power factor of the electrical device, a first voltage sensor 301 configured to detect input voltage information of the PFC circuit 104, a second voltage sensor 302 configured to detect DC link voltage information of the PFC circuit 104, and at least one processor (e.g., at least one processor 303, 902, 1201, or 1420) configured to obtain input voltage information of the electrical device based on the input voltage information detected by the first voltage sensor 301 and the DC link voltage information detected by the second voltage sensor 302, compare the obtained input voltage information with preset reference voltage information to determine whether an input voltage of the electrical device is a low voltage or a high voltage, set a protection level of the PFC circuit 104 according to the determined input voltage, and control an operating cycle of a switch 11 included in the PFC circuit 104 based on the set protection level.

The protection level of the PFC circuit 104 according to an embodiment of the present disclosure may include at least one of an overvoltage protection level, an undervoltage protection level, or an input current limit level.

Upon the setting of the protection level of the PFC circuit 104 according to an embodiment of the present disclosure, the at least one processor may be configured to set, when the determined input voltage is a low voltage, the overvoltage protection level and the undervoltage protection level to be lower than an overvoltage protection level and an undervoltage protection level that are set when the input voltage is a high voltage, and set the input current limit level to be higher than an input current limit level that is set when the input voltage is a high voltage.

Upon the setting of the protection level of the PFC circuit 104 according to an embodiment of the present disclosure, the at least one processor may be configured to set, when the determined input voltage is a low voltage, the overvoltage protection level and the undervoltage protection level to be lower than an overvoltage protection level and an undervoltage protection level that are set when the input voltage is a high voltage.

Upon the setting of the protection level of the PFC circuit 104 according to an embodiment of the present disclosure, the at least one processor may be configured to set, when the determined input voltage is a low voltage, the input current limit level to be higher than an input current limit level that is set when the input voltage is a high voltage.

The at least one processor according to an embodiment of the present disclosure may be configured to control, when the determined input voltage is a low voltage, an operation of the PFC circuit 104 such that a DC link maximum boost level of the PFC circuit 104 is equal to a DC link maximum boost level when the input voltage is a high voltage.

The electrical device according to an embodiment of the present disclosure may include a load 105, and the at least one processor may be configured to increase, when the determined input voltage is a low voltage, the overvoltage protection level together with a DC link voltage of the PFC circuit 104 in response to a voltage command based on an operation of the load 105.

The at least one processor according to an embodiment of the present disclosure may be configured to control, when the determined input voltage is a low voltage, an operation of the PFC circuit 104 to start boosting the DC link voltage at a lower voltage than when the input voltage of the electrical device is a high voltage.

The electrical device according to an embodiment of the present disclosure may include a relay 901 in front of the PFC circuit 104, and the at least one processor may be configured to detect a rising slope of the DC link voltage, and control, according to the detected rising slope of the DC link voltage being greater than or equal to a preset reference value, an operation of the relay 901 to turn the relay 901 off.

A method of controlling an electrical device (e.g., electrical device 100, 300, 900, 1200, or 1400) including a PFC circuit 104 according to an embodiment of the present disclosure may include detecting input voltage information of the PFC circuit 104 by at least one processor (e.g., at least one processor 303, 902, 1201, or 1420) of the electrical device, detecting DC link voltage information of the PFC circuit 104 by the at least one processor, obtaining, by the at least one processor, input voltage information of the electrical device based on the input voltage information and the detected DC link voltage information, comparing, by the at least one processor, the obtained input voltage information with preset reference voltage information to determine whether an input voltage of the electrical device is a low voltage or a high voltage, setting, by the at least one processor, a protection level of the PFC circuit 104 according to the determined input voltage, and controlling an operating cycle of a switch 11 included in the PFC circuit 104 based on the set protection level.

The setting of the protection level of the PFC circuit 104 according to an embodiment of the present disclosure may include setting, by the at least one processor, when the determined input voltage is a low voltage, an overvoltage protection level of the PFC circuit 104 and an undervoltage protection level of the PFC circuit 104 to be lower than an overvoltage protection level and an undervoltage protection level that are set when the input voltage is a high voltage, and setting an input current limit level of the PFC circuit 104 to be higher than an input current limit level that is set when the input voltage is a high voltage.

The setting of the protection level of the PFC circuit 104 according to an embodiment of the present disclosure may include setting, by the at least one processor, when the determined input voltage is a low voltage, an overvoltage protection level of the PFC circuit 104 and an undervoltage protection level of the PFC circuit 104 to be lower than an overvoltage protection level and an undervoltage protection level that are set when the input voltage is a high voltage.

The setting of the protection level of the PFC circuit 104 according to an embodiment of the present disclosure may include setting, by the at least one processor, when the determined input voltage is a low voltage, an input current limit level of the PFC circuit 104 to be higher than an input current limit level that is set when the input voltage is a high voltage.

The method according to an embodiment of the present disclosure may include controlling, by the at least one processor, when the determined input voltage is a low voltage, an operation of the PFC circuit 104 such that a DC link maximum boost level of the PFC circuit 104 is equal to a DC link maximum boost level when the input voltage is a high voltage.

The setting of the protection level of the PFC circuit 104 according to an embodiment of the present disclosure may include performing control of increasing, when the determined input voltage is a low voltage, an overvoltage protection level together with a DC link voltage of the PFC circuit 104 in response to a voltage command based on an operation of a load 105 included in the electrical device.

The method according to an embodiment of the present disclosure may include controlling, when the determined input voltage is a low voltage, an operation of the PFC circuit 104 to start boosting a DC link voltage at a lower voltage than when an input voltage of the electrical device is a high voltage.

The method according to an embodiment of the present disclosure may include detecting a rising slope of the DC link voltage of the PFC circuit 104, and turning off a relay 901 positioned in front of the PFC circuit 104 according to the detected rising slope of the DC link voltage being greater than or equal to a preset reference value.

A machine-readable storage medium may be provided in the form of a non-transitory storage medium, wherein the term 'non-transitory' may simply refer to that the storage medium is a tangible device, and does not include a signal (e.g., an electromagnetic wave), but this term does not differentiate between where data is semi-permanently stored in the storage medium and where the data is temporarily stored in the storage medium. For example, a 'non-transitory storage medium' may include a buffer in which data is temporarily stored.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloadable or uploadable) online via an application store or between two user devices (e.g., smart phones) directly. When distributed online, at least part of the computer program product (e.g., a downloadable app) may be temporarily generated or at least temporarily stored in the machine-readable storage medium, such as a memory of the manufacturer's server, a server of the application store, or a relay server.

While this invention has been described with reference to illustrative embodiments, this description is not intended to be construed in a limiting sense. Various modifications and combinations of the illustrative embodiments, as well as other embodiments of the invention, may be apparent to persons skilled in the art upon reference to the description. It is therefore intended that the appended claims encompass any such modifications or embodiments.

What is claimed is:

1. An electrical device, comprising:

a power factor correction circuit comprising a switch and configured to correct a power factor of the electrical device;

a first voltage sensor configured to detect first input voltage information of the power factor correction circuit;

a second voltage sensor configured to detect direct current (DC) link voltage information of the power factor correction circuit;

a memory storing instructions; and at least one processor communicatively coupled to the power factor correction circuit, the first voltage sensor, the second voltage sensor, and the memory, wherein the at least one processor is configured to execute the instructions to:

obtain second input voltage information of the electrical device, based on the first input voltage information and the DC link voltage information;

compare the second input voltage information with preset reference voltage information;

determine, based on a comparison of the second input voltage information with the preset reference voltage information, whether an input voltage of the electrical device is at least one of a low voltage or a high voltage;

set a protection level of the power factor correction circuit based on the input voltage; and control an operating cycle of the switch of the power factor correction circuit, based on the protection level of the power factor correction circuit.

2. The electrical device of claim 1, wherein the protection level of the power factor correction circuit comprises at least one of an overvoltage protection level, an undervoltage protection level, or an input current limit level.

3. The electrical device of claim 2, wherein the at least one processor is further configured to execute the instructions to:

set the overvoltage protection level to a first overvoltage protection level based on the input voltage being the low voltage, the first overvoltage protection level being lower than a second overvoltage protection level based on the input voltage being the high voltage;

set the undervoltage protection level to a first undervoltage protection level based on the input voltage being the low voltage, the first undervoltage protection level being lower than a second undervoltage protection level based on the input voltage being the high voltage; and set the input current limit level to a first current limit level based on the input voltage being the low voltage, the first current limit level being higher than a second current limit level based on the input voltage being the high voltage.

4. The electrical device of claim 2, wherein the at least one processor is further configured to execute the instructions to:

set the overvoltage protection level to a first overvoltage protection level based on the input voltage being the low voltage, the first overvoltage protection level being lower than a second overvoltage protection level based on the input voltage being the high voltage; and set the undervoltage protection level to a first undervoltage protection level based on the input voltage being the low voltage, the first undervoltage protection level being lower than a second undervoltage protection level based on the input voltage being the high voltage.

5. The electrical device of claim 2, wherein the at least one processor is further configured to execute the instructions to:

set the input current limit level to a first current limit level based on the input voltage being the low voltage, the first current limit level being higher than a second current limit level set based on the input voltage being the high voltage.

6. The electrical device of claim 1, wherein the at least one processor is further configured to execute the instructions to:

control, based on the input voltage being the low voltage, an operation of the power factor correction circuit such that a first DC link maximum boost level of the power factor correction circuit is equal to a second DC link maximum boost level when the input voltage is the high voltage.

7. The electrical device of claim 6, further comprising:

a load, wherein the at least one processor is further configured to execute the instructions to:

receive a voltage command based on an operation of the load; and increase, based on the voltage command and the input voltage being the low voltage, the overvoltage protection level and a DC link voltage of the power factor correction circuit.

8. The electrical device of claim 7, wherein the at least one processor is further configured to execute the instructions to:

control, based on the input voltage being the low voltage, an operation of the power factor correction circuit to start boosting the DC link voltage at a first voltage, the first voltage being lower than a second voltage of the DC link voltage when the input voltage is the high voltage.

9. The electrical device of claim 7, further comprising:

a relay disposed in front of the power factor correction circuit, wherein the at least one processor is further configured to execute the instructions to:

detect a rising slope of the DC link voltage; and control, based on the rising slope of the DC link voltage being greater than or equal to a preset reference value, an operation of the relay to turn the relay off.

10. A method of controlling an electrical device, the method comprising:

detecting, by at least one processor of the electrical device, first input voltage information of a power factor correction circuit of the electrical device;

detecting, by the at least one processor, direct current (DC) link voltage information of the power factor correction circuit;

obtaining, by the at least one processor, second input voltage information of the electrical device based on the first input voltage information and the DC link voltage information;

comparing, by the at least one processor, the second input voltage information with preset reference voltage information;

determining, based on the comparing of the second input voltage information with the preset reference voltage information, whether an input voltage of the electrical device is at least one of a low voltage or a high voltage;

setting, by the at least one processor, a protection level of the power factor correction circuit, based on the input voltage; and controlling an operating cycle of a switch of the power factor correction circuit based on the protection level of the power factor correction circuit.

11. The method of claim 10, wherein the protection level of the power factor correction circuit comprises at least one of an overvoltage protection level, an undervoltage protection level, or an input current limit level.

12. The method of claim 11, wherein the setting of the protection level comprises:

setting, by the at least one processor, the overvoltage protection level to a first overvoltage protection level based on the input voltage being the low voltage, the first overvoltage protection level being lower than a second overvoltage protection level based on the input voltage being the high voltage;

setting, by the at least one processor, the undervoltage protection level to a first undervoltage protection level based on the input voltage being the low voltage, the first undervoltage protection level being lower than a second undervoltage protection level based on the input voltage being the high voltage; and setting, by the at least one processor, the input current limit level to a first current limit level based on the input voltage being the low voltage, the first current limit level being higher than a second current limit level based on the input voltage being the high voltage.

13. The method of claim 11, wherein the setting of the protection level comprises:

setting, by the at least one processor, the overvoltage protection level to a first overvoltage protection level based on the input voltage being the low voltage, the first overvoltage protection level being lower than a second overvoltage protection level based on the input voltage being the high voltage; and setting, by the at least one processor, the undervoltage protection level to a first undervoltage protection level based on the input voltage being the low voltage, the first undervoltage protection level being lower than a second undervoltage protection level based on the input voltage being the high voltage.

14. The method of claim 11, wherein the setting of the protection level comprises:

setting, by the at least one processor, the input current limit level to a first current limit level based on the input voltage being the low voltage, the first current limit level being higher than a second current limit level based on the input voltage being the high voltage.

15. The method of claim 10, further comprising:

controlling, by the at least one processor, based on the input voltage being the low voltage, an operation of the power factor correction circuit such that a first DC link maximum boost level of the power factor correction circuit is equal to a second DC link maximum boost level when the input voltage is the high voltage.

16. The method of claim 10, wherein the setting of the protection level comprises:

receiving a voltage command based on an operation of a load of the electrical device; and increasing, based on the voltage command and the input voltage being the low voltage, an overvoltage protection level together with a DC link voltage of the power factor correction circuit.

17. The method of claim 16, wherein the setting of the protection level further comprises:

controlling, based on the input voltage being the low voltage, an operation of the power factor correction circuit to start boosting the DC link voltage at a first voltage, the first voltage being lower than a second voltage of the DC link voltage when the input voltage is the high voltage.

18. The method of claim 16, wherein the setting of the protection level further comprises:

detecting a rising slope of the DC link voltage; and turning off a relay based on the rising slope of the DC link voltage being greater than or equal to a preset reference value, wherein the relay is disposed in front of the power factor correction circuit.

* * * * *